United States Patent
Ohsawa et al.

(10) Patent No.: US 8,049,998 B2
(45) Date of Patent: Nov. 1, 2011

(54) MAGNETORESISTANCE EFFECT DEVICE AND METHOD FOR MANUFACTURING SAME, MAGNETIC MEMORY, MAGNETIC HEAD, AND MAGNETIC RECORDING APPARATUS

(75) Inventors: Yuichi Ohsawa, Kanagawa-ken (JP); Shiho Nakamura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 916 days.

(21) Appl. No.: 12/073,171

(22) Filed: Feb. 29, 2008

(65) Prior Publication Data

US 2008/0213627 A1 Sep. 4, 2008

(30) Foreign Application Priority Data

Mar. 1, 2007 (JP) ................................. 2007-052079

(51) Int. Cl.
*G11B 5/39* (2006.01)

(52) U.S. Cl. ...................................................... 360/324

(58) Field of Classification Search .................. 360/324
See application file for complete search history.

(56) References Cited

U.S. PATENT DOCUMENTS

| | | | |
|---|---|---|---|
| 5,862,022 A | 1/1999 | Noguchi et al. | |
| 6,456,468 B1 * | 9/2002 | Hayashi | 360/324.1 |
| 6,873,500 B2 * | 3/2005 | Hasegawa et al. | 360/324.11 |
| 7,558,029 B2 * | 7/2009 | Ide et al. | 360/324.12 |
| 7,583,482 B2 * | 9/2009 | Sbiaa et al. | 360/324.12 |

FOREIGN PATENT DOCUMENTS

| | | |
|---|---|---|
| JP | 10-255231 | 9/1998 |
| JP | 2002-270922 | 9/2002 |
| JP | 2004-342167 | 12/2004 |
| JP | 2005-353819 | 12/2005 |

OTHER PUBLICATIONS

Y. Ohsawa, "Current-driven resistance change and magnetoresistance measurements in NiFe films with a nanoconstriction", *IEEE Trans. Magn.*, vol. 42, No. 10, 2006, pp. 2615-2617.

Y. Ohsawa, "In-situ magnetoresistance measurements of a nanoconstricted NiFe film with in-plan configuration," *IEEE Trans. Magn.*, vol. 41, No. 10, 2005, pp. 2577-2579.

Hayashi, Kazuhiko Magnetoresistance head and spin valve head—basic and applied—, The second edition, Maruzen Co., Ltd., Japan, Jul. 15, 2002, pp. 48-49.

Office Action in Japanese Application No. 2007-052079 dated Mar. 2, 2009 and English-language translation thereof.

Office Action in Japanese Application No. 2007-052079 dated Sep. 1, 2009 and English-language translation thereof.

* cited by examiner

*Primary Examiner* — Mark Blouin

(74) *Attorney, Agent, or Firm* — Nixon & Vanderhye, P.C.

(57) ABSTRACT

A magnetoresistance effect device includes: an insulator layer; a first and second ferromagnetic layer laminated to sandwich the insulator layer; a magnetic bias layer laminated with the second ferromagnetic layer; and a connecting section formed discontinuously on a side face of the insulator layer. The connecting section is not interposed between the second ferromagnetic layer and the magnetic bias layer. The connecting section is made of a ferromagnetic material, and electrically connecting between the first ferromagnetic layer and the second ferromagnetic layer. A method for manufacturing a magnetoresistance effect device includes: laminating a first and second ferromagnetic layer to sandwich an insulator layer, and laminating a magnetic bias layer with the second ferromagnetic layer; and forming a connecting section for electrically connecting between the first ferromagnetic layer and the second ferromagnetic layer by discontinuously forming a ferromagnetic material on a side face of the insulator layer.

21 Claims, 31 Drawing Sheets

MAGNETORESISTANCE EFFECT DEVICE AND METHOD FOR MANUFACTURING SAME, MAGNETIC MEMORY, MAGNETIC HEAD, AND MAGNETIC RECORDING APPARATUS

CROSS-REFERENCE TO RELATED APPLICATIONS

This application is based upon and claims the benefit of priority from the prior Japanese Patent Application No. 2007-052079, filed on Mar. 1, 2007; the entire contents of which are incorporated herein by reference.

BACKGROUND OF THE INVENTION

1. Field of the Invention

This invention relates to a magnetoresistance effect device exhibiting an especially high magnetoresistance effect, a magnetic memory display/input apparatus, and a method for manufacturing them, a magnetic head, and a magnetic recording apparatus including the magnetic head.

2. Background Art

Recently, magnetic recording density in hard disk drives has rapidly increased, and reproducing sensitivity and reproducing resolution required for the reproducing head have also increased accordingly year by year. The advent of the GMR (giant magnetoresistance effect) head operating on the principle of spin-dependent scattering has dramatically enhanced the output and has been adapted to the increase of recording density. Furthermore, reproducing device structures are proposed for responding to higher recording density.

More recently, nonvolatile solid memory devices have been reported in which domain walls in a metal magnetic material are treated as information. The magnetic moment is determined on the basis of electron spin information, and a domain wall is formed at the boundary of the spin information. Hence studies have been vigorously pursued to drive a domain wall by electron current, which is more adaptable to downscaling, instead of the conventional technique of driving a domain wall by magnetic field.

JP-A 2002-270922 (Kokai) discloses a magnetoresistance device in which a magnetic body having a constricted structure is provided between two magnetic bodies.

There is another device in which a domain wall is confined in a wire having two, large and small, magnetic "constrictions". The large constriction has a low resistance (information "0"), and the small constriction has a high resistance (information "1"). Rewriting between "0" and "1" is conducted by moving a domain wall between the constrictions by current drive. The inventor confirmed a magnetoresistance effect (MR) of approximately 10 to 20% at a point contact that is formed by two-dimensionally and three-dimensionally constricting a sputtered NiFe (permalloy) film by ion milling (Y. Ohsawa, "Current-driven resistance change and magnetoresistance measurements in NiFe films with a nanoconstriction", IEEE Trans. Magn., vol. 42, No. 10, p. 2615 (2006); Y. Ohsawa, "In-situ magnetoresistance measurements of a nanoconstricted NiFe film with in-plane configuration", IEEE Trans. Magn., vol. 41, No. 10, p. 2577 (2005)).

In these disclosed techniques, a magnetic body is patterned to form a point contact. However, even by the latest lithography technique, it is not easy to form an ideal point contact with good reproducibility, and there is no further enhancement in the magnetoresistance effect.

On the other hand, JP-A 2004-342167 (Kokai) discloses a manufacturing method in which an insulating film is sandwiched on both sides between magnetic layers, which are interconnected by a discontinuous magnetic film, thereby connecting between the upper and lower magnetic layers at a small contact. In this disclosed technique, on a magnetic sensitive layer are formed an insulating section and a reference magnetic section, which are smaller in area than the magnetic sensitive layer. Magnetic bodies are formed on the reference magnetic section and the magnetic sensitive section. As the amount of formation of the magnetic bodies is gradually increased, a portion arises where the stepped portion between the magnetic sensitive section and the reference magnetic section becomes conducting through the formed magnetic bodies. This conducting portion is used as a small contact. Then a domain control section and an upper electrode are formed on the reference magnetic section.

However, in this disclosed technique, the magnetic body serving as a small contact is sandwiched between the reference magnetic section and the domain control section.

SUMMARY OF THE INVENTION

According to an aspect of the invention, there is provided a magnetoresistance effect device including: an insulator layer; a first and second ferromagnetic layer laminated to sandwich the insulator layer; a magnetic bias layer laminated with the second ferromagnetic layer; and a connecting section formed discontinuously on a side face of the insulator layer, the connecting section being not interposed between the second ferromagnetic layer and the magnetic bias layer, being made of a ferromagnetic material, and electrically connecting between the first ferromagnetic layer and the second ferromagnetic layer.

According to another aspect of the invention, there is provided a magnetoresistance effect device including: an insulator layer; a first and second ferromagnetic layer laminated to sandwich the insulator layer; a magnetic bias layer laminated with the second ferromagnetic layer; and a connecting section formed discontinuously on a side face of the insulator layer, a side face of the second ferromagnetic layer, and a side face of the magnetic bias layer, the connecting section being made of a ferromagnetic material and electrically connecting between the first ferromagnetic layer and the second ferromagnetic layer.

According to still another aspect of the invention, there is provided a method for manufacturing a magnetoresistance effect device, including: laminating a first and second ferromagnetic layer to sandwich an insulator layer, and laminating a magnetic bias layer with the second ferromagnetic layer; and forming a connecting section for electrically connecting between the first ferromagnetic layer and the second ferromagnetic layer by discontinuously forming a ferromagnetic material on a side face of the insulator layer.

According to still another aspect of the invention, there is provided a magnetic memory including: a magnetoresistance effect device including: an insulator layer; a first and second ferromagnetic layer laminated to sandwich the insulator layer; a magnetic bias layer laminated with the second ferromagnetic layer; and a connecting section formed discontinuously on a side face of the insulator layer, the connecting section being not interposed between the second ferromagnetic layer and the magnetic bias layer, being made of a ferromagnetic material, and electrically connecting between the first ferromagnetic layer and the second ferromagnetic layer, a current being passed between the first ferromagnetic layer and the second ferromagnetic layer to perform at least one of writing and reading.

According to still another aspect of the invention, there is provided a magnetic head including: a magnetoresistance effect device including: an insulator layer; a first and second ferromagnetic layer laminated to sandwich the insulator layer; a magnetic bias layer laminated with the second ferromagnetic layer; and a connecting section formed discontinuously on a side face of the insulator layer, the connecting section being not interposed between the second ferromagnetic layer and the magnetic bias layer, being made of a ferromagnetic material, and electrically connecting between the first ferromagnetic layer and the second ferromagnetic layer, the magnetic head being operable to read information magnetically recorded on a magnetic recording medium.

According to still another aspect of the invention, there is provided a magnetic recording apparatus including: a magnetic head including: a magnetoresistance effect device including: an insulator layer; a first and second ferromagnetic layer laminated to sandwich the insulator layer; a magnetic bias layer laminated with the second ferromagnetic layer; and a connecting section formed discontinuously on a side face of the insulator layer, the connecting section being not interposed between the second ferromagnetic layer and the magnetic bias layer, being made of a ferromagnetic material, and electrically connecting between the first ferromagnetic layer and the second ferromagnetic layer.

DETAILED DESCRIPTION OF THE INVENTION

An embodiment of the invention will now be described in detail with reference to the drawings.

Figure 1:
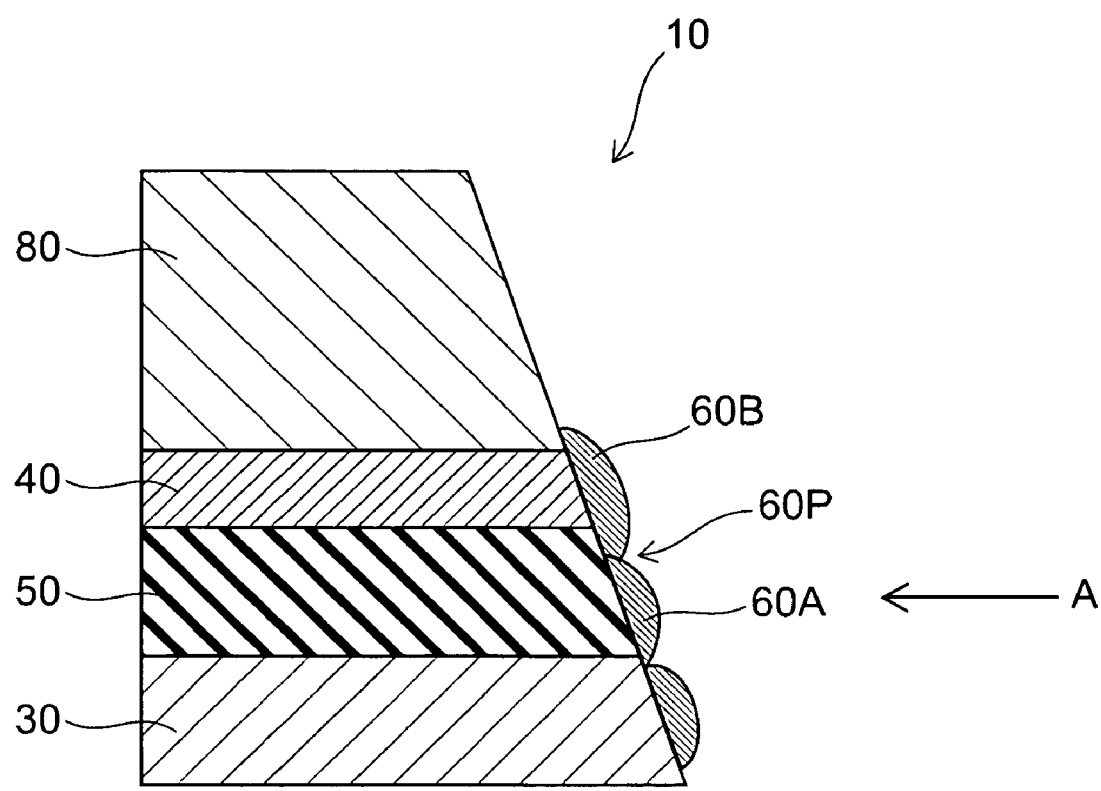
FIG. 1 is a conceptual view showing the cross-sectional structure of a magnetoresistance effect device according to the embodiment of the invention.
Figure 2:
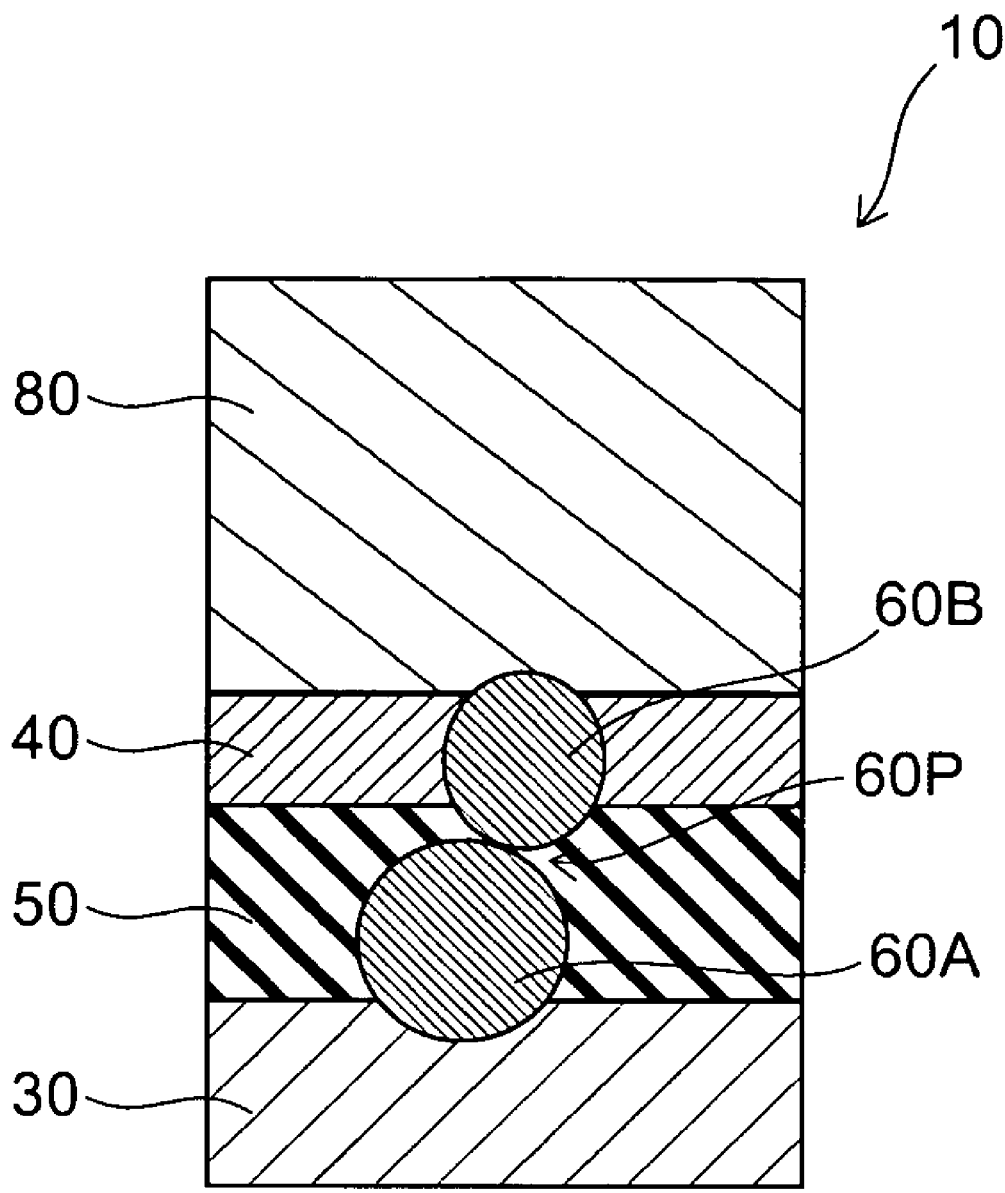
FIG. 2 is a conceptual view of the magnetoresistance effect device as viewed in the direction of arrow A.

FIG. 1 is a conceptual view showing the cross-sectional structure of a magnetoresistance effect device according to the embodiment of the invention. FIG. 2 is a conceptual view of this magnetoresistance effect device as viewed in the direction of arrow A.

The magnetoresistance effect device 10 of this example comprises a first ferromagnetic layer 30, a second ferromagnetic layer 40, a magnetic bias layer 80 laminated with the second ferromagnetic layer 40, an insulator layer 50 provided between the first and second ferromagnetic layer 30, 40, and a connecting section 60 discontinuously provided on the side face of the insulator layer 50. The magnetic bias layer 80 serves to fix the magnetization of the second ferromagnetic layer 40 to a prescribed direction and can be illustratively made of an antiferromagnet. The connecting section 60 is made of a ferromagnet and electrically connects between the first and second ferromagnetic layer 30, 40. At least part of the connecting section 60B formed on the side face of the second ferromagnetic layer 40 is also in contact with the side face of the magnetic bias layer 80. The connecting section 60 is not a continuous thin film, but has a discontinuous structure such as an island structure including a plurality of islands, a mesh structure connected like a network, or a pinhole structure including a plurality of pinholes.

The thickness of the insulator layer 50 can be approximately two to more than ten nanometers, for example. The connecting section 60 discontinuously provided on the side face of the insulator layer 50 has a narrowest section 60P having the narrowest width halfway on the path of current flowing between the first ferromagnetic layer 30 and the second ferromagnetic layer 40. In this example, the narrowest section 60P is a boundary where a first island 60A is in contact with a second island 60B. The narrowest section 60P acts as a point contact. While FIG. 2 shows only two islands 60A, 60B, the connecting section 60 may include three or more islands.

Each of the islands 60A, 60B may be illustratively a single crystal grain or a polycrystal. For example, the magnetic material in the vicinity of the narrowest section 60P can be configured so that crystal grains 60A, 60B oriented in different directions are interconnected on the side face of the insulator layer 50. Then the crystal grain boundary between the crystal grains 60A, 60B can serve as a point contact for confining a domain wall. The size of the crystal grains 60A, 60B is 10 to 20 nm at a maximum in the normal formation condition, and approximately 3 to 5 nm in the initial phase of growth. Hence the width of the grain boundary of the narrowest section 60P formed by the connection between two such crystal grains 60A, 60B is sufficiently small, forming a narrow point contact. Consequently, a high magnetoresistance effect is achieved. That is, it is possible to detect with high sensitivity the relative relationship between the magnetization direction of the first ferromagnetic layer 30 and the magnetization direction of the second ferromagnetic layer 40.

Figure 30:
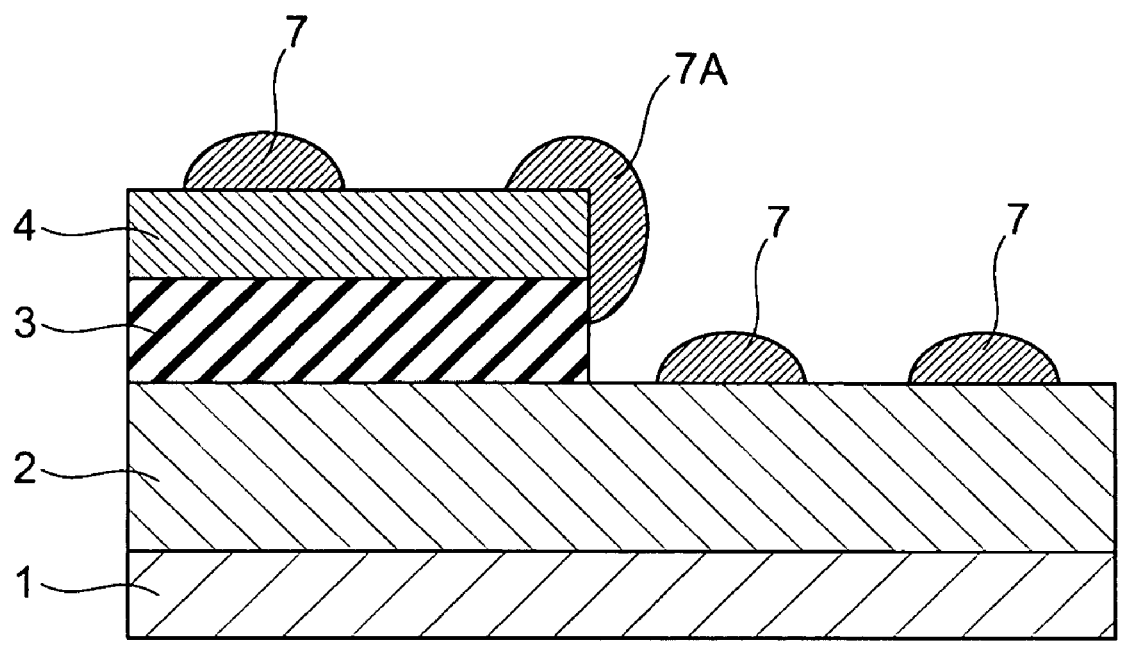
FIG. 30 is a schematic view showing a method for manufacturing a reproducing magnetic head of a comparative example.
Figure 31:
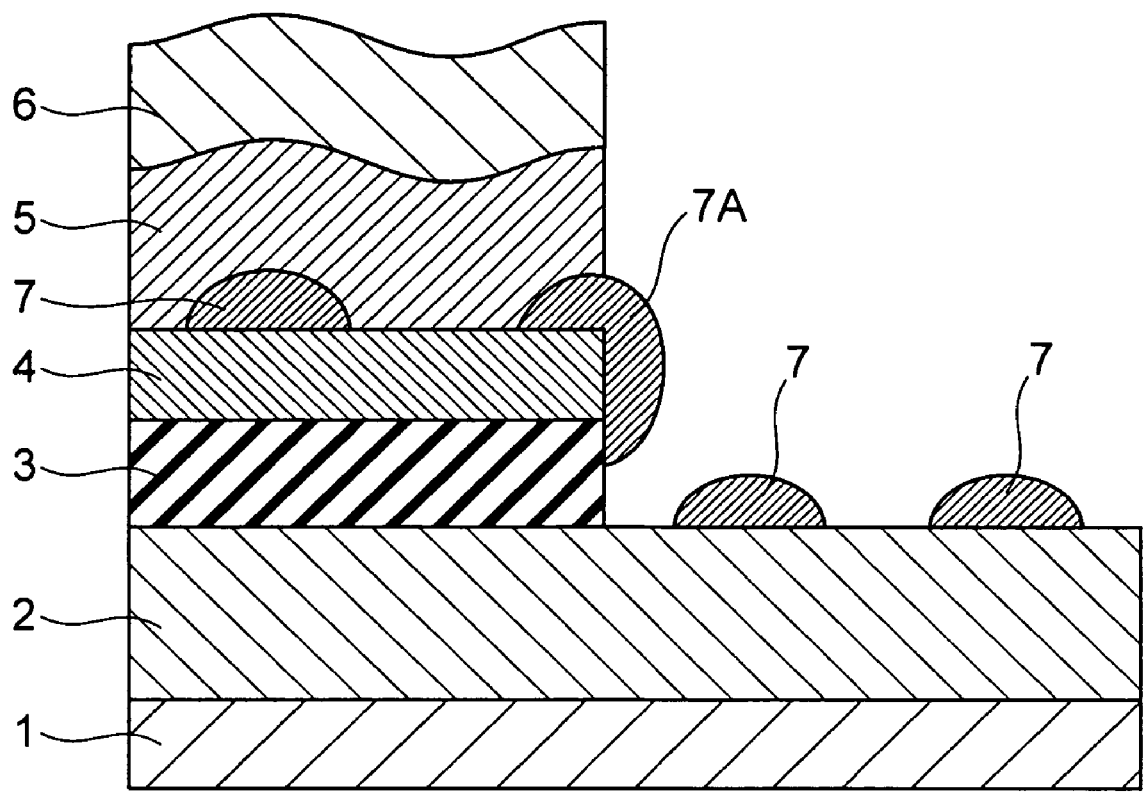
FIG. 31 is a schematic view showing a method for manufacturing a reproducing magnetic head of a comparative example.

FIGS. 30 and 31 are schematic cross-sectional views illustrating a reproducing magnetic head in the process of manufacturing by the method disclosed in JP-A 2004-342167 (Kokai).

As shown in FIG. 30, a lower electrode 1, a magnetic sensitive section 2, an insulating section 3, and a reference magnetic section 4 are formed. The insulating section 3 and the reference magnetic section 4 are formed smaller than the magnetic sensitive section 2. In this state, magnetic bodies 7 are formed. The magnetic body 7 grows like an island. As the amount of formation is gradually increased, a portion arises where the stepped portion between the magnetic sensitive section 2 and the reference magnetic section 4 becomes conducting through the formed magnetic bodies 7.

Then, as shown in FIG. 31, a domain control section 5 and an upper electrode 6 are formed on the reference magnetic section 4.

However, in this method, as clearly seen in FIG. 31, a magnetic body 7 is interposed between the reference magnetic section 4 and the domain control section 5. In the state shown in FIG. 30, the stepped portion is likely to be a growth nucleus of the magnetic body 7. Hence a magnetic body 7A is likely to intrude between the edge of the reference magnetic section 4 and the domain control section 5. That is, the reference magnetic section 4 becomes, at its edge, a locally thick ferromagnetic layer including the magnetic body 7A.

For example, as the recording density approaches 1 Tbpsi (terabits per square inch), the spacing between the upper and lower shield of the magnetic head needs to be significantly downscaled to approximately 25 to 30 nanometers. In this case, the reference magnetic section 4 has a thickness of at most 2 to 3 nanometers or less. On the other hand, the thickness of the magnetic body 7 for forming a magnetic contact needs at least approximately 1 nanometer. That is, the interposition of the magnetic body 7 results in a region where the thickness of the reference magnetic section 4 is thicker than original by several ten percent or more, and a portion having a decreased pinning magnetic field occurs in the reference magnetic section 4. Furthermore, the edge of the reference magnetic section 4 interposed by the magnetic body 7A is an essential portion where the current selectively flows from/to the magnetic sensitive section 2. In this comparative example, in this essential portion, the effective thickness of the reference magnetic section 4 is significantly thickened due to the existence of the magnetic body 7A.

In a conventional current-perpendicular-to-plane (CPP) device, the local thickness increase of the reference magnetic section 4 does not cause a serious problem. However, as in the reproducing magnetic head of this comparative example, if the local current-carrying region coincides with the degradation region of the pinning magnetic field and the current-carrying region is located on the side face of the magnetic film, then the current magnetic field due to energization, heat generation due to energization, and the demagnetizing field generated on the side face cause magnetization variation in the reference magnetic section 4 and is likely to generate noise.

Furthermore, if the magnetic body 7 for forming a small contact is shaped like an island as small as on the nanometer order, then a large demagnetizing field occurs, and hence a domain wall is likely to be formed inside irrespective of whether the signal magnetic field is present. That is, the resistance may remain high irrespective of the signal magnetic field, and some bias means is required.

As described above, to respond to a high recording density at the 1-Tbpsi level, the thickness of the reference magnetic section 4 is as thin as the thickness of the small contact magnetic body 7. Furthermore, the magnetization of the small contact magnetic body 7 also needs to be firmly fixed as appropriate in order to suppress noise.

In this respect, in this embodiment, the connecting section 60 is not interposed between the second ferromagnetic layer 40 and the magnetic bias layer 80. That is, the connecting section 60 is formed on the side face of the ferromagnetic layer 40 and the magnetic bias layer 80. In this case, the portion of the magnetic body 60B in contact with the magnetic bias layer 80 is subjected to a strong pinning magnetic field due to their direct exchange coupling, which prevents the demagnetizing field from producing domains at the edge of the connecting section 60. On the other hand, the portion of the magnetic body 60B in contact with the ferromagnetic layer 40 is subjected to the pinning magnetic field from the magnetic bias layer 80 through the exchange coupling with the ferromagnetic layer 40. In this embodiment, because the connecting section 60 is not interposed between the ferromagnetic layer 40 and the magnetic bias layer 80, the pinning magnetic field from the magnetic bias layer 80 for fixing the magnetization of the ferromagnetic layer 40 is stably applied to the ferromagnetic layer 40. Consequently, also in the vicinity of the edge of the ferromagnetic layer 40 where the current selectively flows, the magnetization is stably fixed, and noise is suppressed.

By connecting crystal grains to each other, an atomic dislocation/defect on the order of the atomic distance is introduced into the grain boundary. Thus a region having low exchange stiffness is introduced with a length of e.g. 1 nm or less, and the domain wall is confined in this region.

By connecting between crystal grains, which are units having a partly predetermined physical size, the cross-sectional area of the magnetic body in the vicinity of the narrowest section (point contact) 60P can be steeply and discontinuously varied. Thus the domain wall energy, which is proportional to the area of the domain wall, sharply increases with the distance from the narrowest section (point contact) 60P and is more highly localized to the narrowest section 60P, facilitating formation of a narrower domain wall. Furthermore, a domain wall that has migrated into the narrowest section 60P is more likely to be confined in the narrowest section 60P, and hence a stable resistance is obtained more easily.

In the process to grow the magnetic bodies 60A and 60B in a island-growth mode, the growth rate is preferably set quite low in order to control the sizes of the islands 60A and 60B. As the growth rate is set low, residual species such as oxygen (O), fluorine (F) and carbon (C) are likely incorporated from the background atmosphere into the growth front of the islands 60A and 60B. Such incorporated species are effective to reduce the exchange stiffness of the ferromagnetic materials. At the crystal grain boundary, such nonmagnetic elements which may be not contained in the crystal grain often segregate as impurities. That is, the narrowest section 60P has a composition different from that inside the crystal grains 60A, 60B, and thereby the exchange stiffness can be further decreased. Furthermore, localization of at least one of oxygen (O), fluorine (F) and carbon (C) in the narrowest section 60P, for example, enhances electron polarization due to electrons in the 2p orbitals, which leads to enhancement of the magnetoresistance effect. Moreover, by mixing a noble metal such as gold (Au), platinum (Pt), or copper (Cu), the exchange stiffness at the junction can be decreased to form a narrower domain wall, achieving a larger magnetoresistance effect.

Also in the case where the islands 60A, 60B are each formed from polycrystal, the same effect can be achieved if the area of the portion connecting between the islands 60A, 60B is sufficiently small.

As described later in detail, a method for forming a magnetoresistance effect device of this embodiment may comprise the steps of exposing the side face of the first and second ferromagnetic layer 30, 40, the magnetic bias layer 80, and the insulator layer 50 and depositing a ferromagnetic material on this side face to form a connecting section 60. In this case, in the initial growth phase of depositing a connecting section 60, a discontinuous structure such as an island structure, a mesh structure, or a structure including pinholes is formed. For example, each crystal nucleus formed like an island grows as a crystal grain, and the portion of contact between adjacent crystal grains can serve as a narrowest section 60P.

In a conventional deposition method such as evaporation, sputtering, or CVD (chemical vapor deposition), deposition of a material tends to be facilitated on the same material. That is, if a connecting section 60 of a ferromagnetic material is deposited on the side face of the first and second ferromagnetic layer 30, 40, the magnetic bias layer 80, and the insulator layer 50, then the connecting section 60 is more easily deposited on the side face of the first and second ferromagnetic layer 30, 40 and the magnetic bias layer 80 than on the side face of the insulator layer 50. The crystal grains 60A, 60B grown on the first and second ferromagnetic layer 30, 40 and the magnetic bias layer 80 extend onto the side face of the insulator layer 50 and are brought into contact with each other on the side face of the insulator layer 50, thereby forming a narrowest section 60P. That is, an effect of facilitating formation of a point contact on the side face of the insulator layer 50 is achieved.

The crystal grains 60B, 60A grown from the second ferromagnetic layer 40 side and the first ferromagnetic layer 30 side, respectively, are different in their primary role and classified into the crystal grain 60B where the magnetization is fixed and the crystal grain 60A where the magnetization freely varies. Hence, to suppress noise in the magnetoresistance effect device, the magnetization of the crystal grain 60B needs to be firmly fixed at least in the portion in contact with the ferromagnetic layer 40 and the magnetic bias layer 80.

In this example, the crystal grain 60B is subjected to a stable magnetic bias by exchange coupling with the magnetic bias layer 80 and the ferromagnetic layer 40, and a domain wall can be formed only in the narrowest section 60P, hence achieving a high magnetoresistance effect while suppressing noise.

In a conventional top-down formation method, it is extremely difficult to form crystal grains in a discontinuous shape without breaking the connection therebetween. Furthermore, the crystal grain boundary can be located in the most constricted portion by pure coincidence. In contrast, according to this example, the connecting section between crystal grains, or the crystal grain boundary, can be easily located in the narrowest section 60P. The crystal grain boundary junction of the polycrystalline narrowest section 60P is ideal for obtaining a steep constriction and a domain wall. However, JP-A 2002-270922 (Kokai), for example, does not disclose such a crystal grain boundary junction.

The insulator layer 50 can be made of various electrically insulative materials such as alumina or MgO.

The first and second ferromagnetic layer 30, 40 and the connecting section 60 can be illustratively made of a ferromagnetic material such as iron (Fe), cobalt (Co), nickel (Ni), or an alloy, oxide, nitride, or Heusler alloy containing at least one element selected from the group consisting of iron (Fe), cobalt (Co), nickel (Ni), manganese (Mn), and chromium (Cr), or a compound semiconductor or oxide semiconductor containing at least one element of iron (Fe), cobalt (Co), nickel (Ni), manganese (Mn), and chromium (Cr).

For example, in the case where the magnetization of the second ferromagnetic layer is made susceptible to the external magnetic field, a material having a relatively low coercivity such as NiFe (permalloy) is used. The connecting section 60 undergoing electron scattering is made of a Fe-based material such as Fe, FeCo, FeCoNi, and Heusler alloy having high electron polarizability. Thus a high magnetic field sensitivity and a high resistance variation can be obtained.

Figure 3A:
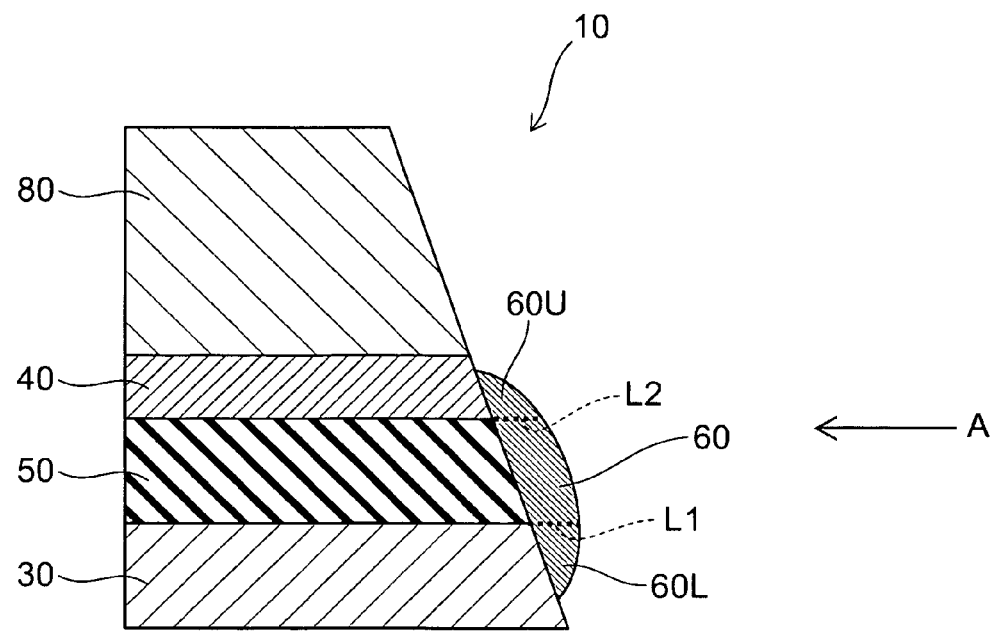
FIG. 3A is a conceptual view showing the cross-sectional structure of another magnetoresistance effect device according to the embodiment of the invention.
Figure 3B:
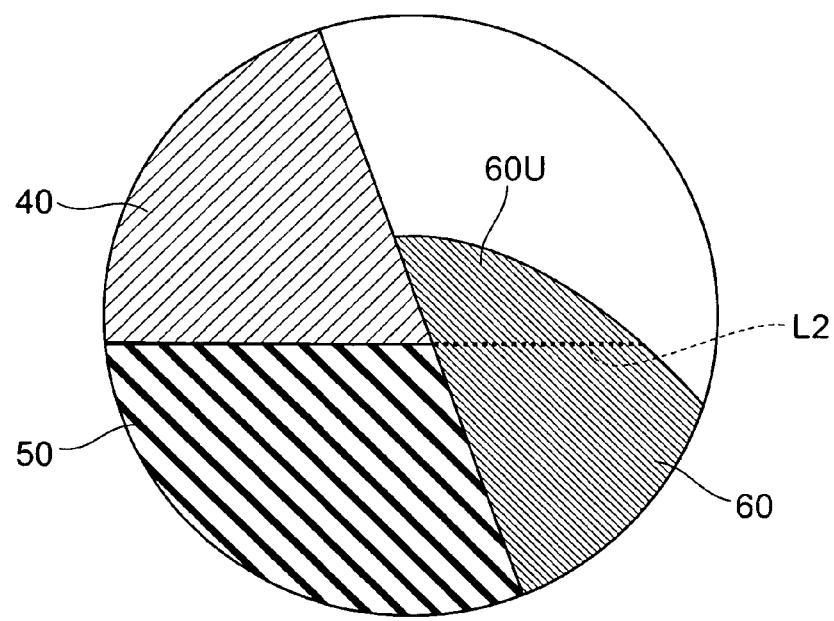
FIG. 3B is a partially enlarged view thereof.

FIG. 3A is a conceptual view showing the cross-sectional structure of another magnetoresistance effect device according to the embodiment of the invention, and FIG. 3B is a partially enlarged view thereof.

Figure 4A:
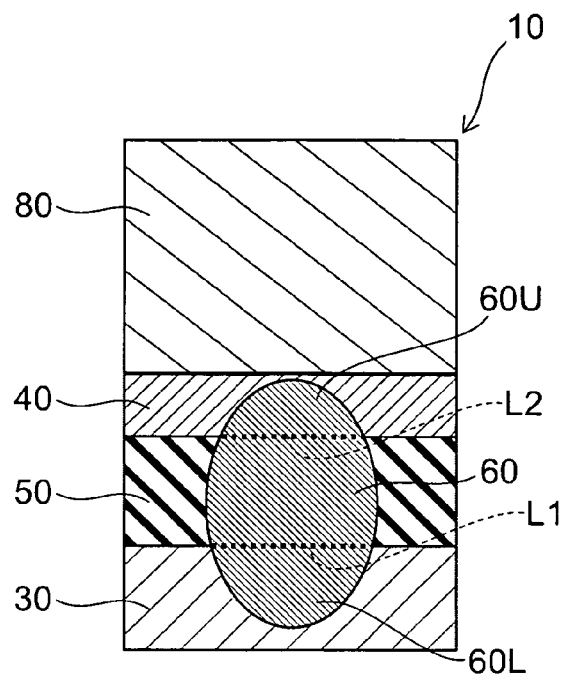
FIG. 4A is a conceptual view of the magnetoresistance effect device as viewed in the direction of arrow A.
Figure 4B:
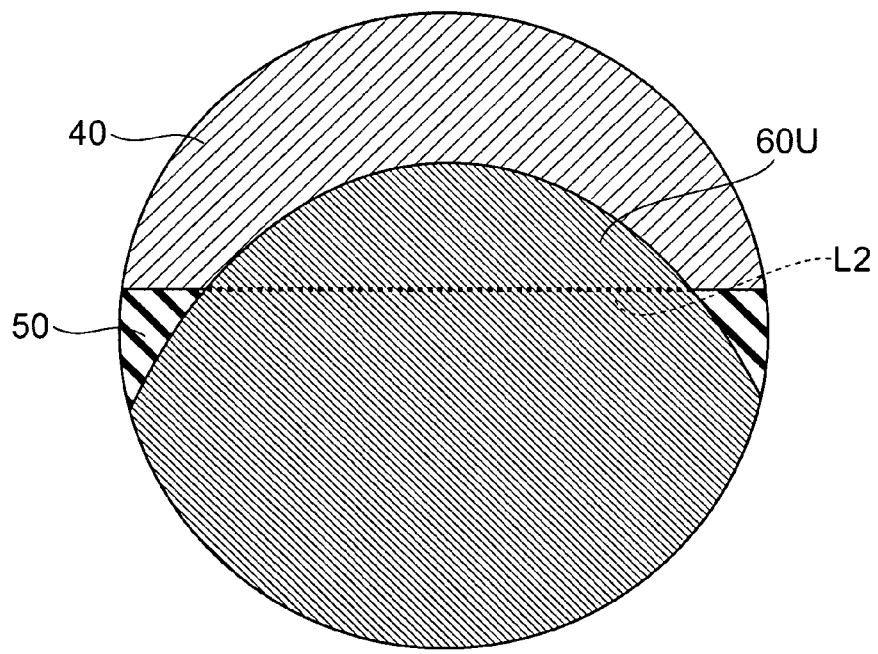
FIG. 4B is a partially enlarged view thereof.

FIG. 4A is a conceptual view of this magnetoresistance effect device as viewed in the direction of arrow A, and FIG. 4B is a partially enlarged view thereof. In FIG. 3 and the following figures, the same components as those described with reference to the previous figures are marked with like reference numerals, and the detailed description thereof is omitted accordingly.

The magnetoresistance effect device 10 of this example also comprises a first ferromagnetic layer 30, a second ferromagnetic layer 40, an insulator layer 50 provided between the first and second ferromagnetic layer 30, 40, and a connecting section 60 of a ferromagnetic material provided on the side face of the insulator layer 50 and electrically connecting between the first and second ferromagnetic layer 30, 40. However, the connecting section 60 is an island extending from the first ferromagnetic layer 30 side over the side face of the insulator layer 50 to the second ferromagnetic layer 40.

Here, in the connecting section 60, it is often the case that the lower portion 60L below the portion indicated by the dashed line L1 is in exchange coupling with the first ferromagnetic layer 30 and that the upper portion 60U above the portion indicated by the dashed line L2 is in exchange coupling with the second ferromagnetic layer 40. In this case, a domain wall is formed in the portion of the dashed line L1, in the portion of the dashed line L2, or between the portion indicated by the dashed line L1 and the portion indicated by the dashed line L2. That is, a point contact is formed between the portion indicated by the dashed line L1 and the portion indicated by the dashed line L2. Also in this case, a high magnetoresistance effect is achieved by controlling the size of the connecting section 60, and it is possible to detect with high sensitivity the relative relationship between the magnetization direction of the first ferromagnetic layer 30 and the magnetization direction of the second ferromagnetic layer 40.

In the example shown in FIGS. 3 and 4, the connecting section 60 does not include any portions in exchange coupling with the magnetic bias layer 80. However, in a magnetic reproducing device at the 1-Tbpsi level, the thickness of the ferromagnetic layer (magnetization fixing layer) 40 is approximately 2 to 3 nanometers or less. Hence the upper portion 60U of the connecting section 60 formed on the sidewall of the ferromagnetic layer 40 is extremely small, and can be regarded as virtually part of the ferromagnetic layer 40. Therefore, if the exchange coupling between the ferromagnetic layer 40 and the magnetic bias layer 80 formed on the ferromagnetic layer 40 is firmly secured along a flat interface, then such a structure as in this example can also operate noise free.

As described later in detail, by the passage of current through the connecting section 60, the position of the domain wall formed in the connecting section 60 can be varied. In the example shown in FIGS. 3 and 4, the cross-sectional area of the connecting section 60 increases as it becomes close to the first ferromagnetic layer 30. That is, as the domain wall is brought close to the first ferromagnetic layer 30 inside the connecting section 60, the area of the domain wall increases. The magnetoresistance decreases as the area of the domain wall increases. This property can be used to realize a magnetic memory for storing information. That is, information can be written by the passage of current to vary the position of the domain wall inside the connecting section 60, and information can be read by detecting the magnetoresistance corresponding to the position of the domain wall by the magnetoresistance effect.

Figure 5:
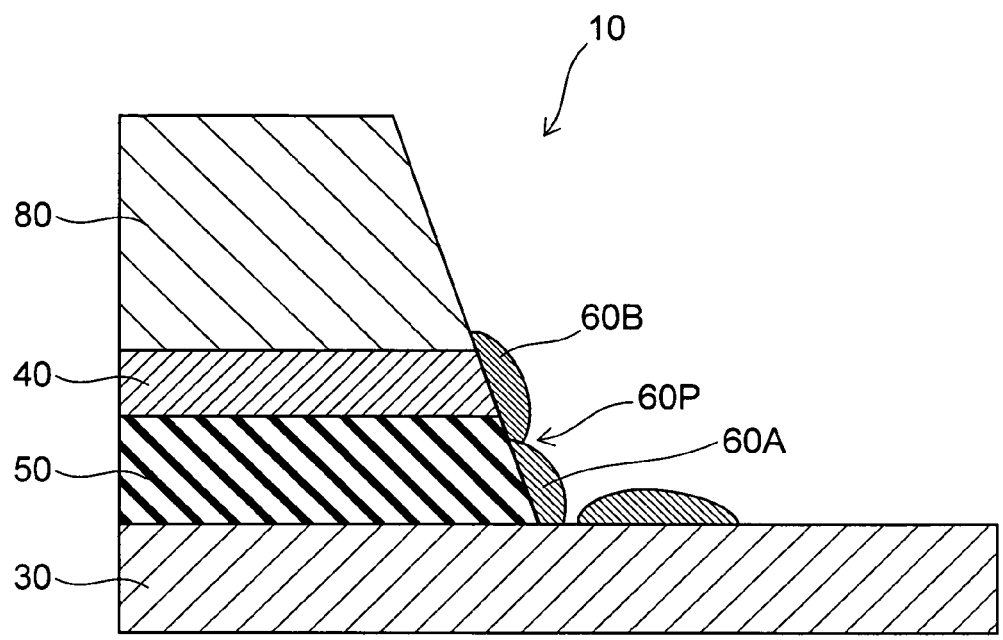
FIG. 5 is a conceptual view showing the cross-sectional structure of a magnetoresistance effect device of a third example according to the embodiment of the invention.

FIG. 5 is a conceptual view showing the cross-sectional structure of a magnetoresistance effect device of a third example according to the embodiment of the invention.

In this example, the side face of a laminated body of the insulator layer 50 and the second ferromagnetic layer 40 is provided upright on the major surface of the first ferromagnetic layer 30. As described above with reference to FIGS. 1 and 2, the connecting section 60 has a first crystal grain 60A and a second crystal grain 60B. These crystal grains 60A, 60B are in contact with each other to form a crystal grain boundary, or a narrowest section 60P, which acts as a point contact. Also in this configuration, the same effect as that described above with reference to FIGS. 1 and 2 is achieved.

Figure 6A:
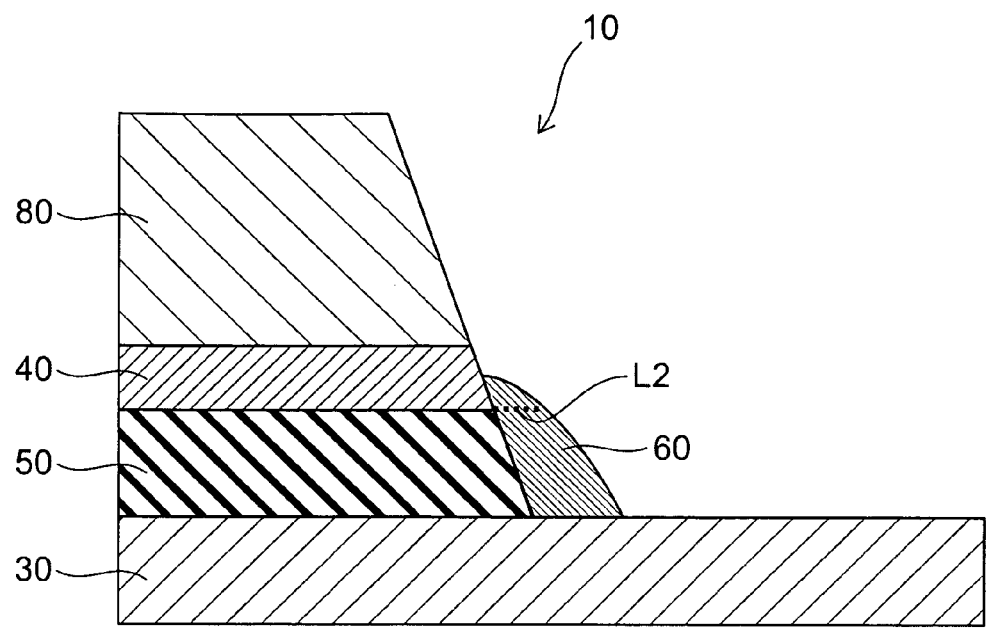
FIGS. 6A and 6B are conceptual views showing the cross-sectional structure of a magnetoresistance effect device of a fourth example according to the embodiment of the invention.
Figure 6B:
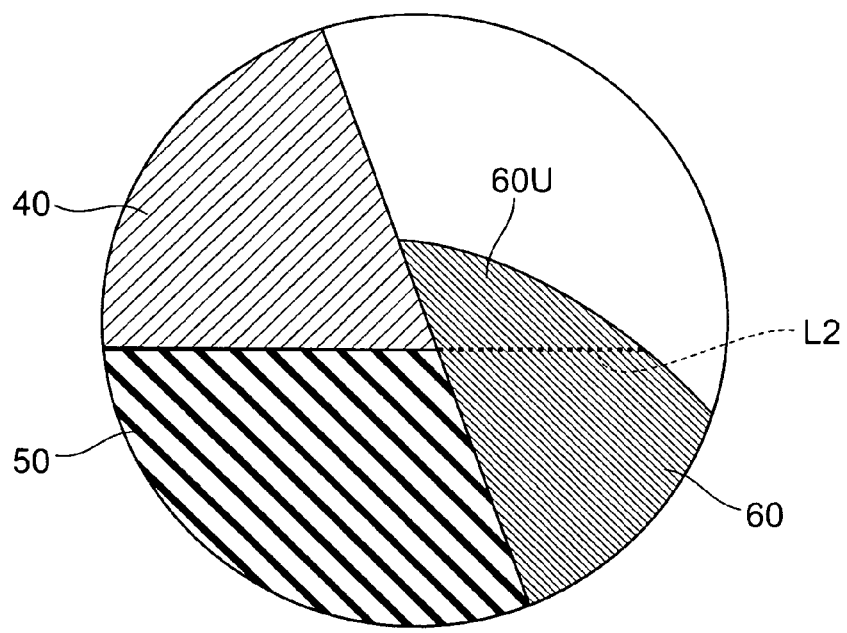

FIG. 6 is a conceptual view showing the cross-sectional structure of a magnetoresistance effect device of a fourth example according to the embodiment of the invention.

Also in this example, as described above with reference to FIG. 5, the side face of a laminated body of the insulator layer 50 and the second ferromagnetic layer 40 is provided upright on the major surface of the first ferromagnetic layer 30. As described above with reference to FIGS. 3 and 4, the connecting section 60 is formed so as to extend from the first ferromagnetic layer 30 over the insulator layer 50 to the second ferromagnetic layer 40. Also in this configuration, the same effect as that described above with reference to FIGS. 3 and 4 is achieved.

In this example, when the connecting section 60 is formed, the connecting section 60 is easily caused to start growing from the major surface of the first ferromagnetic layer 30 and to extend over the side face of the insulator layer 50 to the second ferromagnetic layer 40. In this case, the area of the domain wall formed in the connecting section 60 is large on the side near to the first ferromagnetic layer 30 and small on the side near to the second ferromagnetic layer 40. That is, it is easy to predetermine the direction of whether the magnetoresistance increases or decreases in accordance with the direction of current passed through the connecting section 60. Thus an effect of facilitating formation of the device structure of a magnetic memory is also achieved.

Figure 7:
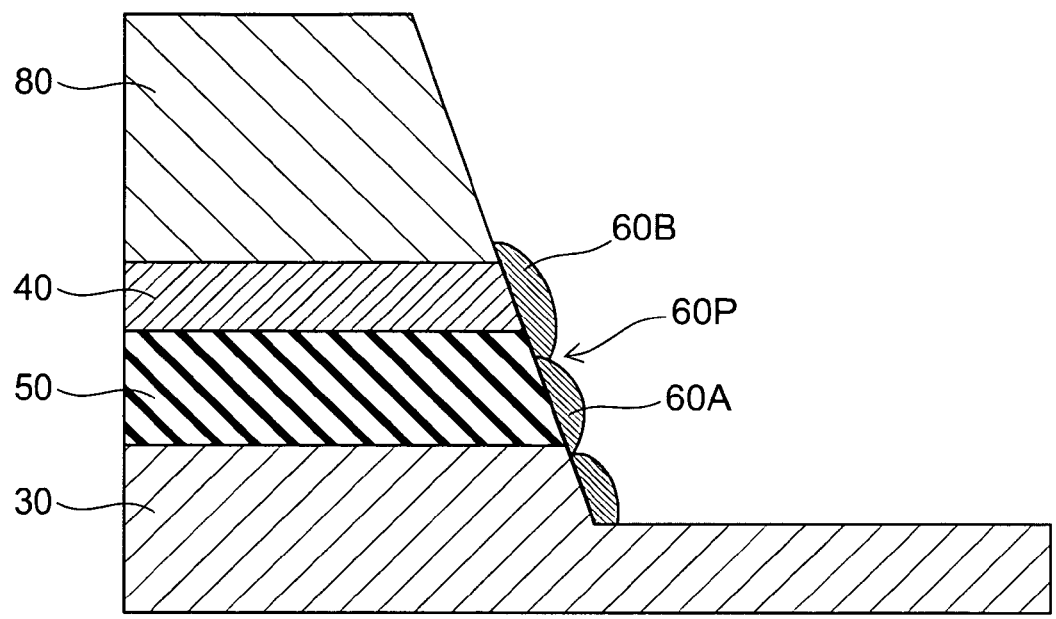
FIG. 7 is a conceptual view showing the cross-sectional structure of a magnetoresistance effect device of a fifth example according to the embodiment of the invention.

FIG. 7 is a conceptual view showing the cross-sectional structure of a magnetoresistance effect device of a fifth example according to the embodiment of the invention.

In this example, a step is formed on the major surface of the first ferromagnetic layer 30, and the side face of the insulator layer 50 and the second ferromagnetic layer 40 is provided upright generally in continuation with this step. As described above with reference to FIGS. 1 and 2, the connecting section 60 has a first crystal grain 60A and a second crystal grain 60B. These crystal grains 60A, 60B are in contact with each other to form a crystal grain boundary, or a narrowest section 60P, which acts as a point contact. Also in this configuration, the same effect as that described above with reference to FIGS. 1 and 2 is achieved.

FIG. 8 is a conceptual view showing the cross-sectional structure of a magnetoresistance effect device of a sixth example according to the embodiment of the invention.

Also in this example, as described above with reference to FIG. 7, a step is formed on the major surface of the first ferromagnetic layer 30, and the side face of a laminated body of the insulator layer 50 and the second ferromagnetic layer 40 is provided on this step. As described above with reference to FIGS. 3 and 4, the connecting section 60 is formed so as to extend from the first ferromagnetic layer 30 over the insulator layer 50 to the second ferromagnetic layer 40. Also in this configuration, the same effect as that described above with reference to FIGS. 3 and 4 is achieved.

Also in this example, when the connecting section 60 is formed, the connecting section 60 is easily caused to start growing from the major surface of the first ferromagnetic layer 30 and to extend over the side face of the insulator layer 50 to the second ferromagnetic layer 40. In this case, the area of the domain wall formed in the connecting section 60 is large on the side near to the first ferromagnetic layer 30 and small on the side near to the second ferromagnetic layer 40. That is, it is easy to predetermine the direction of whether the magnetoresistance increases or decreases in accordance with the direction of current passed through the connecting section

60. Thus an effect of facilitating formation of the device structure of a magnetic memory is achieved.

Figure 8A:
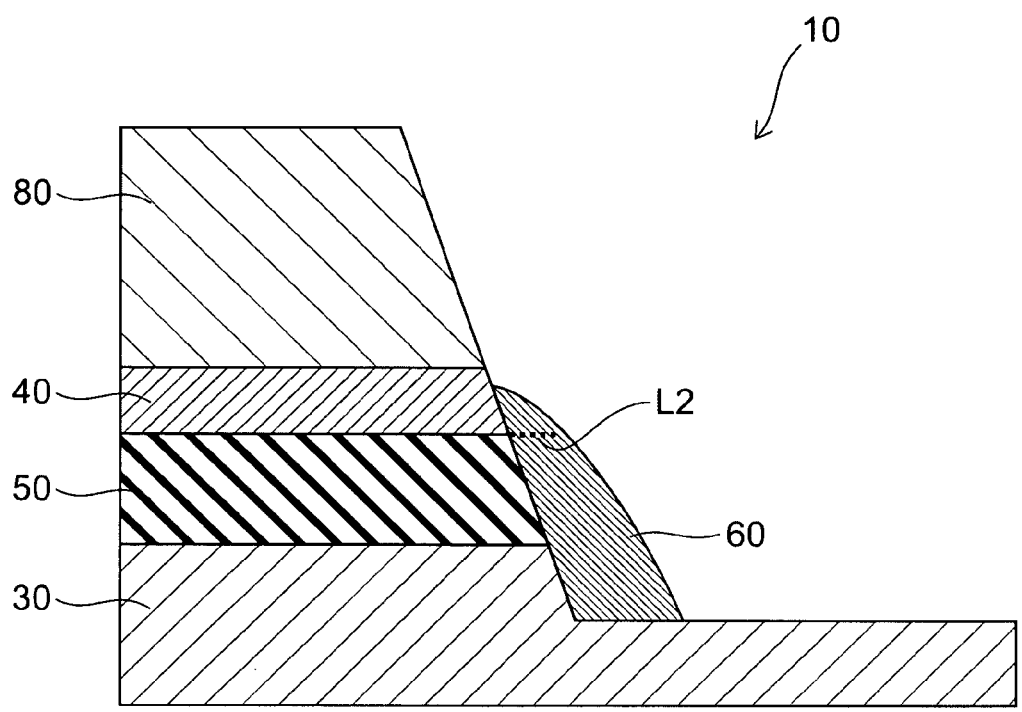
FIGS. 8A and 8B are conceptual views showing the cross-sectional structure of a magnetoresistance effect device of a sixth example according to the embodiment of the invention.
Figure 8B:
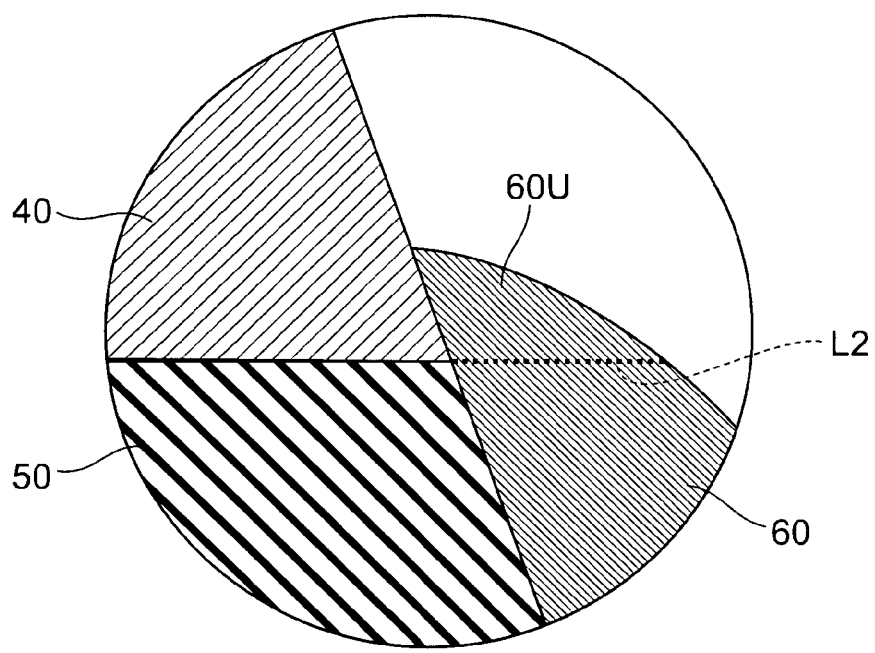

When a step is provided in the ferromagnetic layer 30 as shown in FIG. 8A and the side face of the ferromagnetic layer 40 and the insulator layer 50 is provided upright thereon, an effect described below is achieved in contrast to the case where the ferromagnetic layer 30 is flat as shown in FIG. 6A.

First, because the connecting section 60 is in contact and exchange coupling with the magnetic body 30 on multiple sides, the magnetization information of the ferromagnetic layer (magnetization free layer) 30 can be reliably received. That is, because the connecting section 60 is small and has a large demagnetizing field, reliable exchange coupling with the ferromagnetic layer 30 is essential.

Second, the elements constituting the connecting section 60 have different wettability with each layer, and its droplet-like cross-sectional shape also differs at each interface. Because of being relatively wettable on the ferromagnetic layers 40, 30 composed of the same material as the connecting section 60, the droplet assumes a shape with a small contact angle (low, flattened shape) thereon. However, because of being less wettable on the insulator layer 50, the droplet tends to assume a shape with a large contact angle (elevated, repelled shape) thereon. The variation of the shape of the connecting section 60 for each interface means that the domain wall is confined more easily. That is, in FIG. 8B, the shape of the connecting section 60 discontinuously varies between the L2 portion, which is the boundary between the ferromagnetic layer 40 and the insulator layer 50, and the L1 portion (see FIG. 4A), which is the boundary between the ferromagnetic layer 30 and the insulator layer 50. Such a portion having a varied shape serves to trap a domain wall, leading to more reliable electromagnetic conversion.

In the following, the embodiment of the invention is described in more detail with reference to examples.

Figure 9:
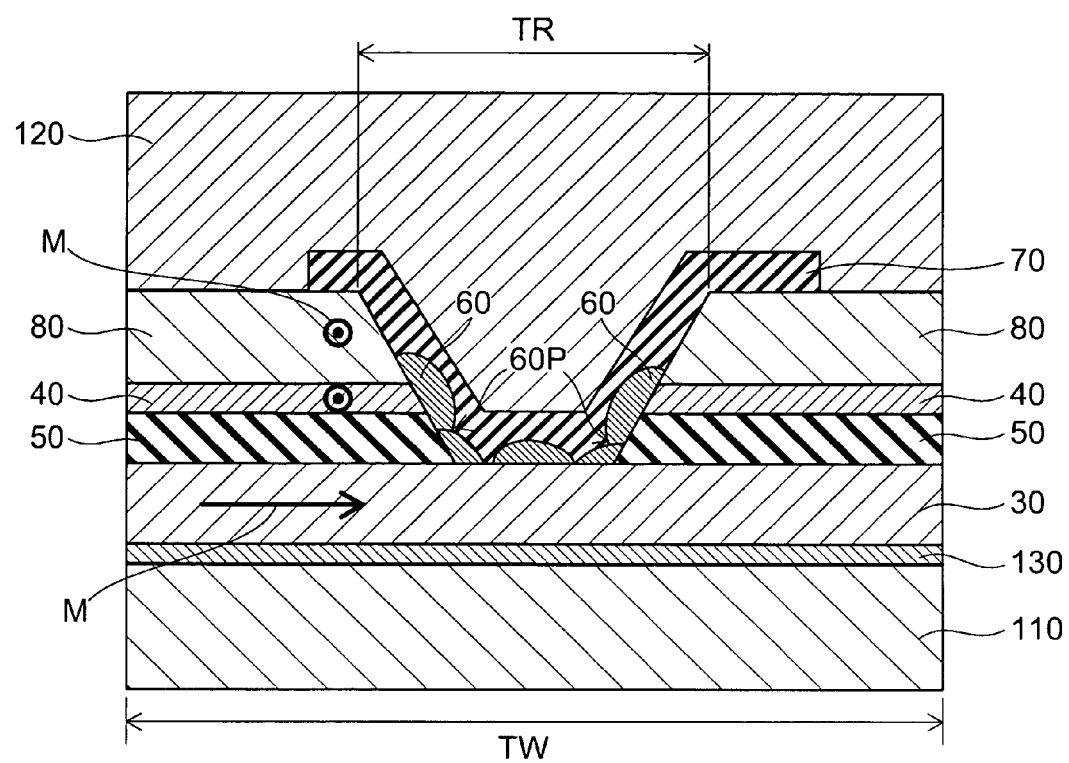
FIG. 9 is a schematic cross-sectional view showing a first example of the magnetoresistance effect device of the invention.

FIG. 9 is a schematic cross-sectional view showing a first example of the magnetoresistance effect device of the invention.

A first ferromagnetic layer 30 and a second ferromagnetic layer 40 are laminated, sandwiching an insulator layer 50 therebetween. A trench is formed in the second ferromagnetic layer 40 and the insulator layer 50. On the sidewall of the trench is formed a connecting section 60 with a narrowest section 60P.

This magnetoresistance effect device can be used as a reading section of a magnetic head. More specifically, the plane of FIG. 9 is set parallel to the air bearing surface (ABS), and the first ferromagnetic layer 30 serves as a magnetization free layer (or simply, free layer) where the direction of magnetization M varies with the external magnetic field. On the other hand, the magnetization M of the second ferromagnetic layer 40 is fixed so that it serves as a magnetization fixing layer (pin layer) insusceptible to the external magnetic field.

Specifically, for example, the first ferromagnetic layer 30 can be made of an NiFe film having a thickness of 5 nm (the track width TW is 30 nm, and the height H is 25 nm square), the insulator layer 50 can be made of an alumina film having a thickness of 5 nm, and the second ferromagnetic layer 40 can be made of an NiFe film having a thickness of 3 nm.

Preferably, an antiferromagnetic layer, not shown, is laminated for fixing the magnetization of the second ferromagnetic layer 40. In this case, the antiferromagnetic layer can be made of various antiferromagnetic films such as a PtMn film and an IrMn film having a thickness of approximately 13 nm. Instead of antiferromagnets, a hard magnetic layer made of a hard magnetic material having a high coercivity of 500 Oe (oersteds) or more such as CoPt or CoPtCr may be provided to fix the magnetization of the second ferromagnetic layer 40.

The trench can be provided substantially in the vicinity of the center of the first ferromagnetic layer 30, and the opening width TR can be approximately 10 nm. As described later in detail, the opening shape of the trench may be circular or striped.

The connecting section 60 can be formed by depositing NiFe to approximately 1 nm in terms of average thickness. Alumina is deposited thereon as an insulator layer 70 to a thickness of approximately 5 nm. Further thereon, via a Ta layer having a thickness of approximately 3 nm, an upper shield (upper electrode) 120 of NiFe having a thickness of approximately 1.5 μm is formed. On the other hand, below the first ferromagnetic layer 30, via a lower gap film 130 of a nonmagnetic material such as Cu having a thickness of approximately 3 nm, a lower shield (lower electrode) 110 of NiFe having a thickness of approximately 1.5 μm is formed.

The lower gap film 130 in contact with the ferromagnetic layer 30 (free layer) is preferably made of a material having higher electric conductivity than the ferromagnetic layer 30. By using such a material, the current flowing in through the contact (connecting section 60) between the ferromagnetic layer 30 and the ferromagnetic layer 40 flows out to the electrode 110 while remaining restricted to a narrow region. Such concentration of the current restricts the current to the vicinity of the region most susceptible to the magnetic field (contact portion between the ferromagnetic layers 30 and 40), allowing efficient electromagnetic conversion. If the lower gap film 130 is made of a nonmagnetic metal having low electric conductivity, the current spreads to the region insusceptible to the signal magnetic field, decreasing the electromagnetic conversion efficiency. Here the region insusceptible to the signal magnetic field refers to both end portions of the ferromagnetic layer (free layer) 30 as viewed in the direction of the track width TW. For example, it is the portion having a decreased permeability under a strong magnetic bias by a bias layer 160 shown in FIG. 15C.

In the magnetoresistance effect device of this example, a narrowest section 60P serving as a point contact is formed in the connecting section 60, achieving a large magnetoresistance effect. The magnetization M of the first ferromagnetic layer 30 varies by the signal magnetic field from the magnetic recording medium, and this variation can be detected with high sensitivity.

The advantage of this structure in the processing point of view is that there is no need for nanosize processing as described in JP-A 2002-270922 (Kokai). That is, there is no need for a process of opening a nanometer-sized hole in an insulating film and burying a magnetic film therein. Because this embodiment only needs to form a relatively large feature (step, mesa, or trench), the processing difficulty can be lowered (yield increased), and the device resistance can be controlled by the peripheral length of contact with the ferromagnetic layer 30. That is, the device resistance can be decreased by increasing the peripheral length, and the device resistance can be increased by decreasing the peripheral length.

Figure 10:
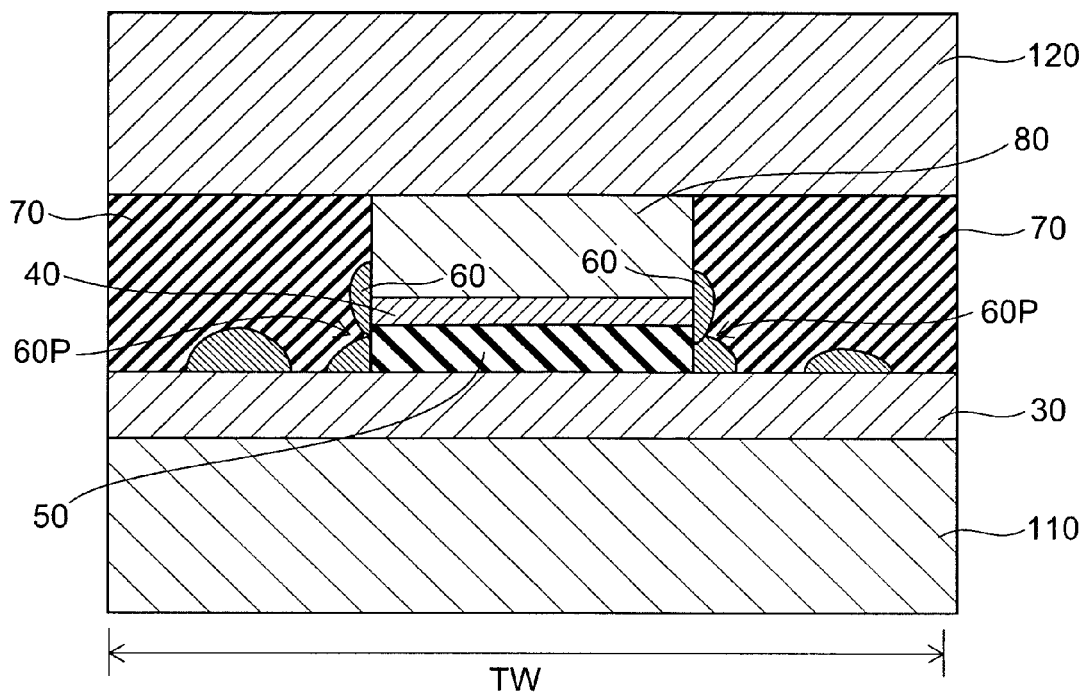
FIG. 10 is a schematic cross-sectional view showing a second example of the magnetoresistance effect device of the invention.

FIG. 10 is a schematic cross-sectional view showing a second example of the magnetoresistance effect device of the invention.

Besides the above structure including a trench, the magnetoresistance effect device can have a structure including a mesa. More specifically, a mesa composed of a second ferromagnetic layer 40 and an insulator layer 50 is formed on the major surface of a first ferromagnetic layer 30. On the sidewall of the mesa is formed a connecting section 60 with a narrowest section 60P.

Also in this example, a narrowest section 60P serving as a point contact is formed in the connecting section 60, achieving a large magnetoresistance effect. The magnetization M of the first ferromagnetic layer 30 varies by the signal magnetic field from the magnetic recording medium, and this variation can be detected with high sensitivity.

In the examples shown in FIGS. 9 and 10, the first ferromagnetic layer 30 and the second ferromagnetic layer 40 may be connected by one island serving as the connecting section 60 as described above with reference to FIGS. 3, 4, 6, and 8.

Figure 11A:
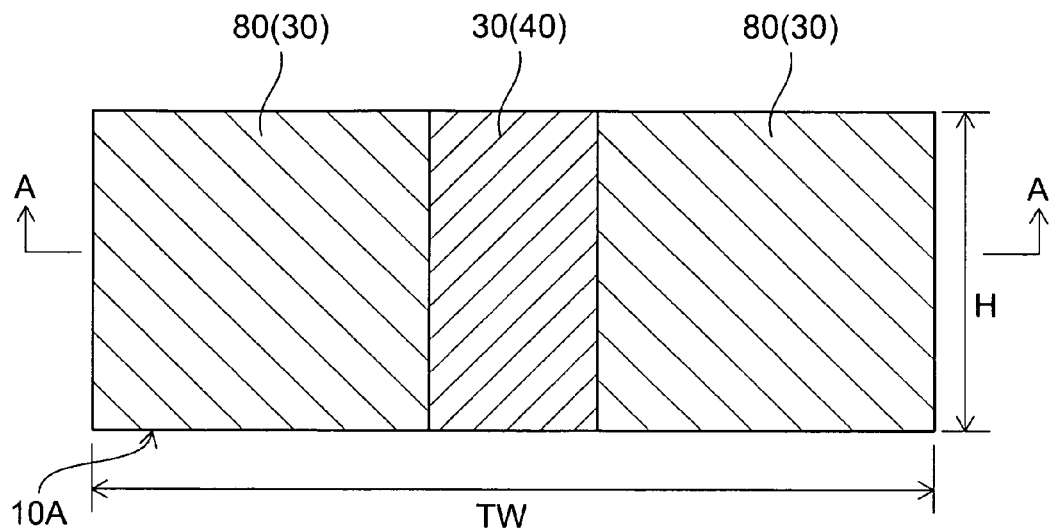
FIGS. 11A through 11C are schematic views for illustrating the shape of the trench or mesa of the magnetoresistance effect device shown in FIGS. 9 and 10.
Figure 11B:
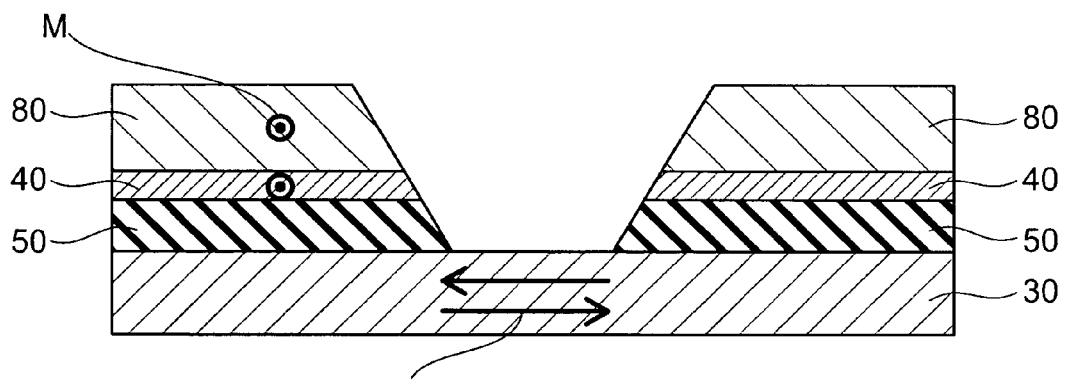
Figure 11C:
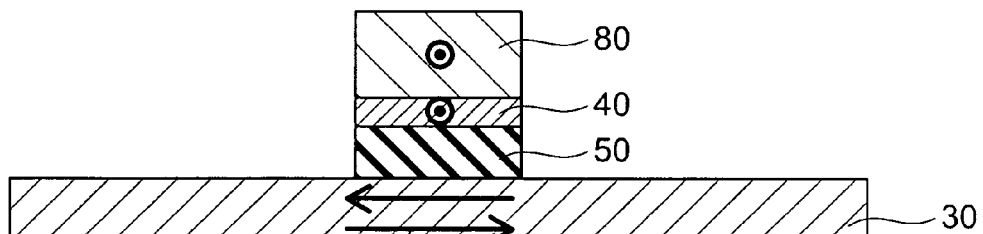
Figure 12A:
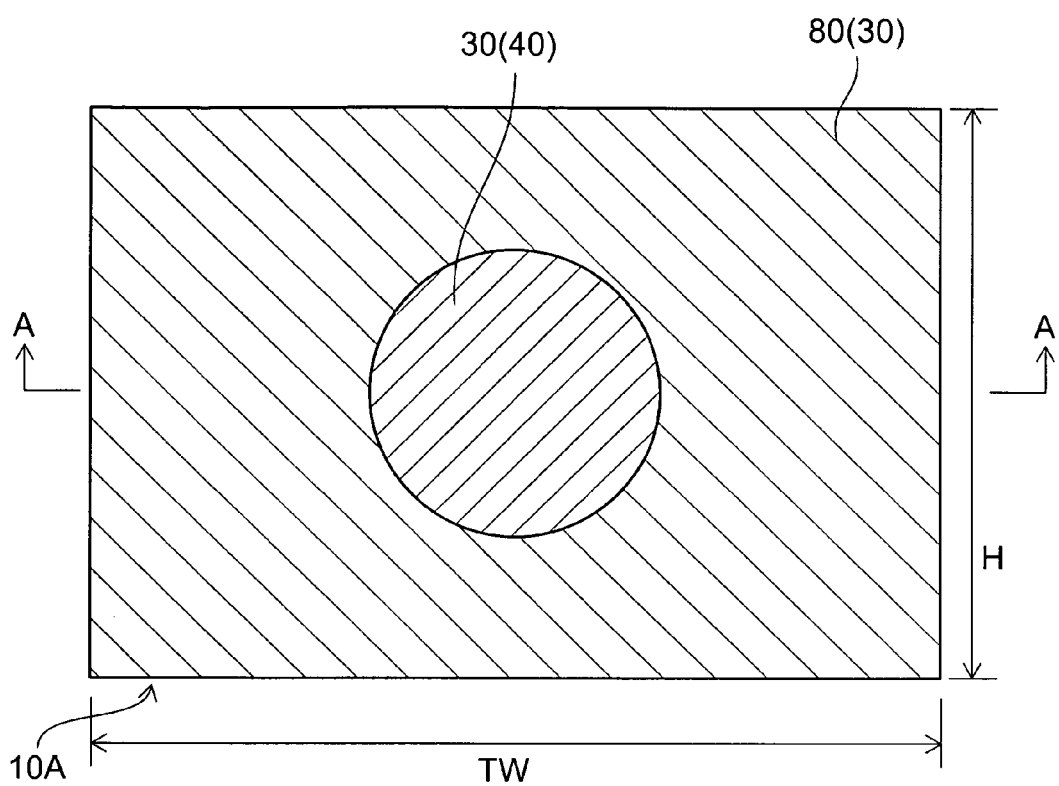
FIGS. 12A through 12C are schematic views for illustrating the shape of the trench or mesa of the magnetoresistance effect device shown in FIGS. 9 and 10.
Figure 12B:
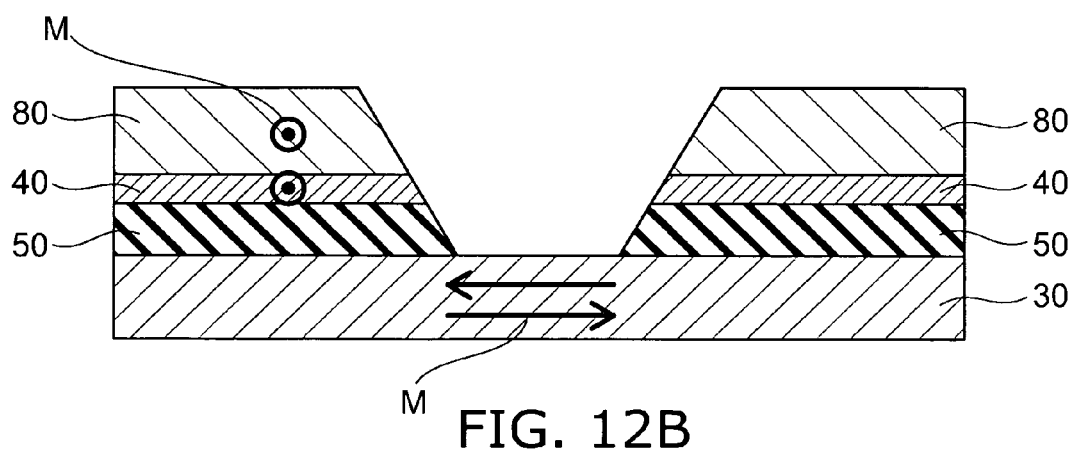
Figure 12C:
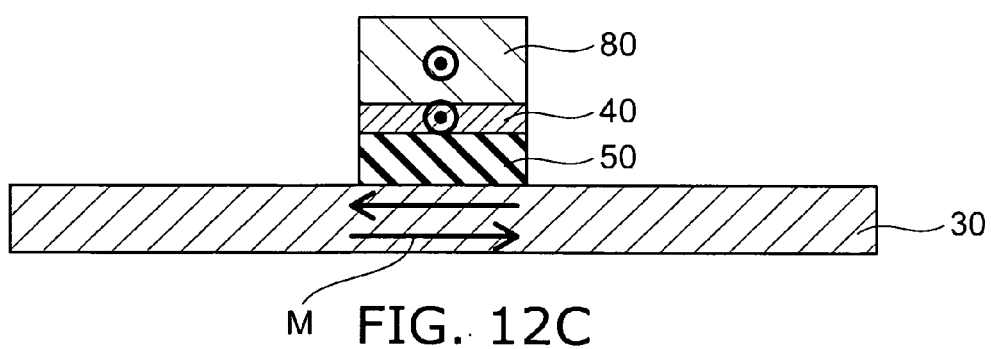
Figure 13A:
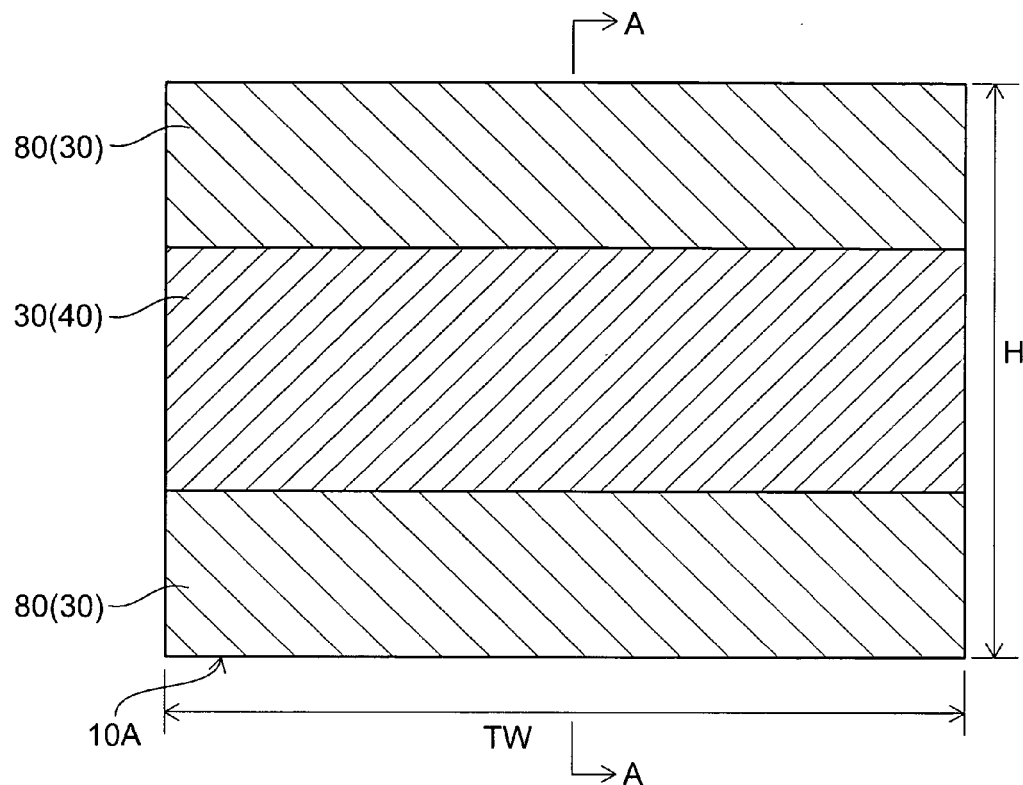
FIGS. 13A through 13C are schematic views for illustrating the shape of the trench or mesa of the magnetoresistance effect device shown in FIGS. 9 and 10.
Figure 13B:
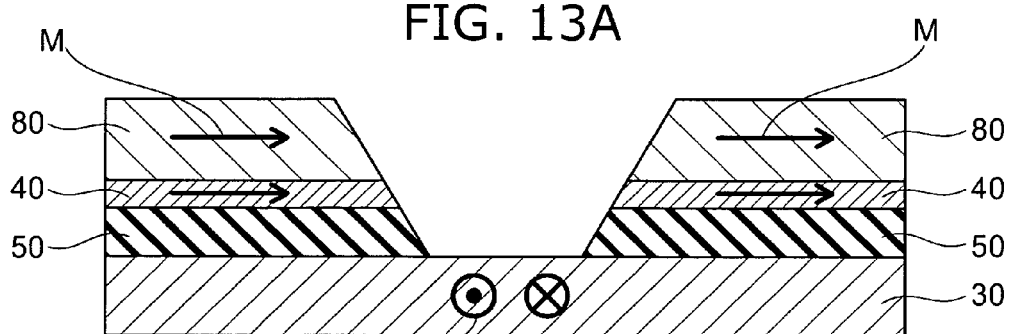
Figure 13C:
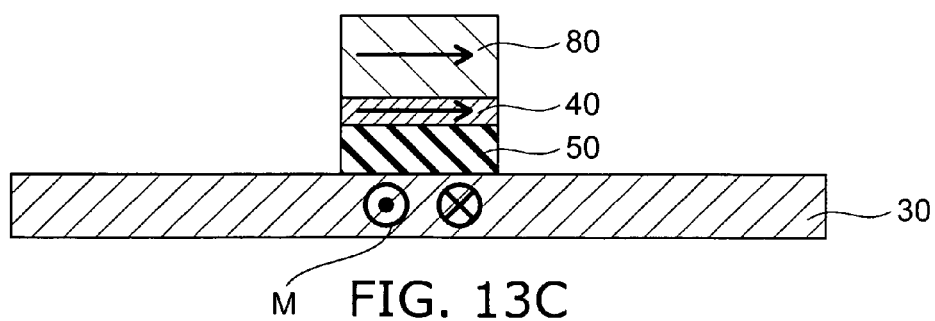

FIGS. 11 to 13 are schematic views for illustrating the planar shape of the trench or mesa of the magnetoresistance effect device shown in FIGS. 9 and 10. More specifically, FIGS. 11A, 12A, and 13A are schematic views showing the planar shape of the trench or mesa, FIGS. 11B, 12B, and 13B are cross-sectional views taken along line A-A in which the trench illustrated in FIG. 9 is formed, and FIGS. 11C, 12C, and 13C are cross-sectional views taken along line A-A in which the mesa illustrated in FIG. 10 is formed. In these figures, the connecting section 60 is not shown for convenience.

In the example shown in FIG. 11, the trench or mesa extends perpendicular to the air bearing surface 10A. In the example shown in FIG. 12, the trench or mesa is formed in a generally circular shape. In the example shown in FIG. 13, the trench or mesa extends parallel to the air bearing surface 10A.

In any of these cases, the track width TW parallel to the air bearing surface 10A is e.g. 30 nm, and the height H can be e.g. approximately 25 nm. The magnetization M of the first ferromagnetic layer (free layer) 30 is oriented in the track width (TW) direction when there is no signal magnetic field. On the other hand, the magnetization M of the second ferromagnetic layer 40 is fixed to the height H direction.

On the side face of the second ferromagnetic layer 40, the magnetization M tends to be oriented parallel to the side face by the demagnetizing field. In the example shown in FIG. 13, the magnetization M of the second ferromagnetic layer 40 is fixed perpendicular to the side face of the trench or mesa. Hence the direction of the magnetization M is likely to vary on the side face of the trench or mesa. The side face of the trench or mesa is where the connecting section 60 is formed and the magnetoresistance effect is detected. Hence, if the direction of the magnetization M of the second ferromagnetic layer 40 is deviated, it is difficult to accurately detect the direction of the magnetization M of the first ferromagnetic layer 30, or the information of the signal magnetic field from the medium.

In contrast, in the example shown in FIG. 11, the magnetization M of the second ferromagnetic layer 40 is fixed parallel to the side face of the trench or mesa. Hence the direction of the magnetization M is difficult to vary on the side face of the trench or mesa. That is, the direction of the magnetization M of the second ferromagnetic layer 40 is not deviated in the portion where the connecting section 60 is formed and the magnetoresistance effect is detected. Consequently, the direction of the magnetization M of the first ferromagnetic layer 30, or the information of the signal magnetic field from the medium, can be accurately detected, and a high output is easily obtained.

The example shown in FIG. 12 has an intermediate structure between that shown in FIG. 11 and that shown in FIG. 13. More specifically, on the side face of the circular trench or mesa, the direction of the magnetization M of the first ferromagnetic layer 30 may be detected slightly less accurately in the portion nearly parallel to the air bearing surface 10A, but can be detected accurately in the portion nearly perpendicular to the air bearing surface 10A.

In summary, it is more preferable that the side face of the trench or mesa, or the side face where the connecting section 60 is formed, be nearly parallel to the direction of magnetization of the magnetization fixing layer than perpendicular thereto.

FIGS. 14 and 15 are process cross-sectional views illustrating a method for manufacturing a magnetoresistance effect device of the example shown in FIG. 10.

Figure 14A:
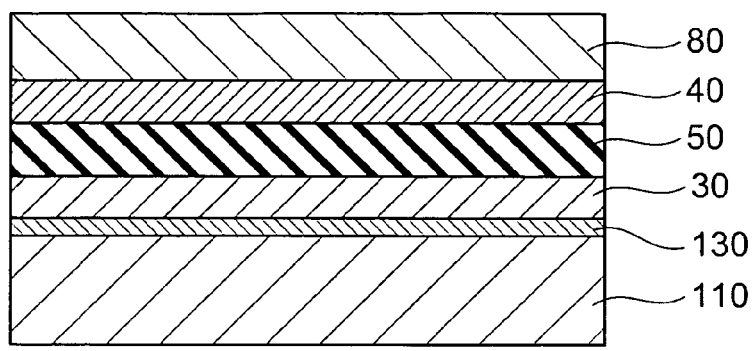
FIGS. 14A through 14C are process cross-sectional views illustrating a method for manufacturing a magnetoresistance effect device of the example shown in FIG. 10.

First, an NiFe film having a thickness of approximately 1.5 μm is formed as a lower shield 110 serving as a lower electrode on a substrate, not shown. After the surface of the lower shield 110 is polished and planarized, as shown in FIG. 14A, a lower gap film 130 of Ta having a thickness of approximately 3 nm, a first ferromagnetic layer 30 of NiFe having a thickness of approximately 5 nm, an insulator layer 50 of alumina having a thickness of approximately 5 nm, a second ferromagnetic layer 40 of NiFe having a thickness of approximately 3 nm, a magnetic bias layer 80 of an antiferromagnetic material such as PtMn having a thickness of approximately 13 nm, and a cap layer (not shown) of Ta having a thickness of approximately 3 nm are successively formed.

Figure 14B:
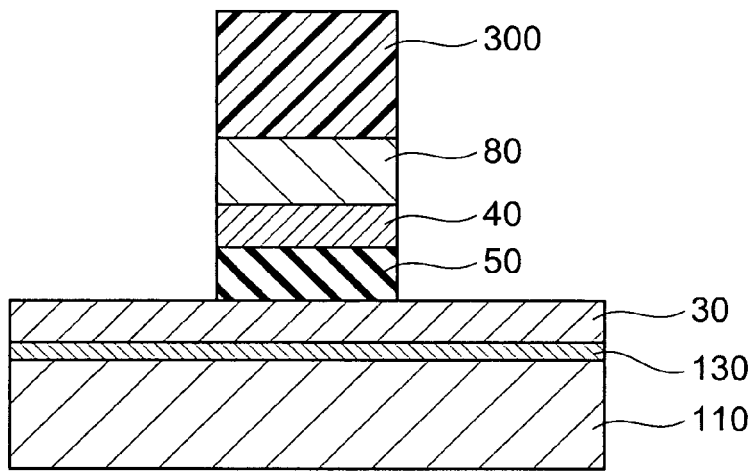

Next, as shown in FIG. 14B, in the vicinity of the center of the portion corresponding to the track width, a resist mask 300 is linearly formed with a width of 10 nm by EB (electron beam) lithography, and etching is performed down to the surface of the first ferromagnetic layer 30 by ion milling. Here, the endpoint at the surface of the first ferromagnetic layer 30 is easily obtained by transferring the pattern to an $SiO_2$ or other hard mask, performing RIE (reactive ion etching) with chlorine-based or carbon monoxide and ammonia-based gas, and stopping the etching at the insulator layer 50 of alumina, followed by ion milling.

Figure 14C:
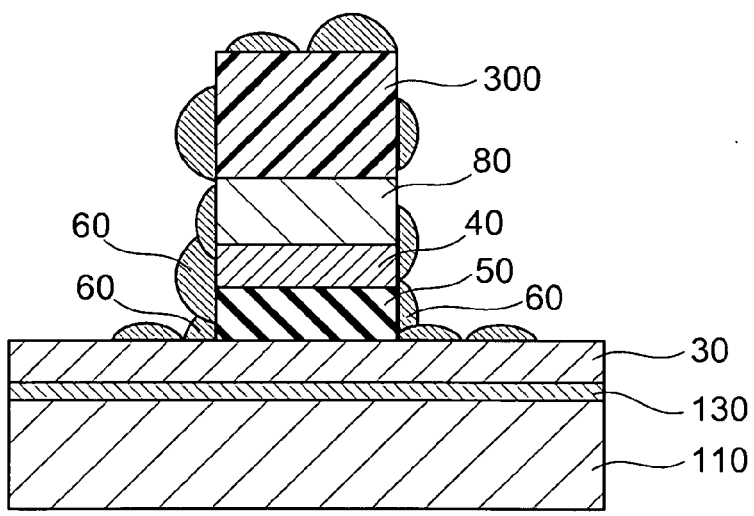

Next, as shown in FIG. 14C, a connecting section 60 of NiFe is formed by ion beam sputtering with an average flat-surface thickness of approximately 2 nm. Furthermore, its surface is etched approximately 1 nm by ion beams to form the connecting section 60 having an average thickness of approximately 1 nm. Thus a discontinuous connecting section 60 shaped like an island can be formed on the side face of the insulator layer 50. By irradiating the sample surface with ion beams before film formation by ion beam sputtering, small defects can be introduced into the surface. Consequently, a fine connecting section 60 can be formed, and a small narrowest section (point contact) 60P can be formed.

Here, by repeating film formation and etching a plurality of times in forming the connecting section 60, the magnetoresistance effect was often enhanced due to the introduction of oxygen and defects into the junction interface even for a final reduced thickness of 1 nm. It is noted that in depositing the connecting section 60, the conventional sputtering or vacuum evaporation may be used instead of ion beam sputtering.

Figure 15A:
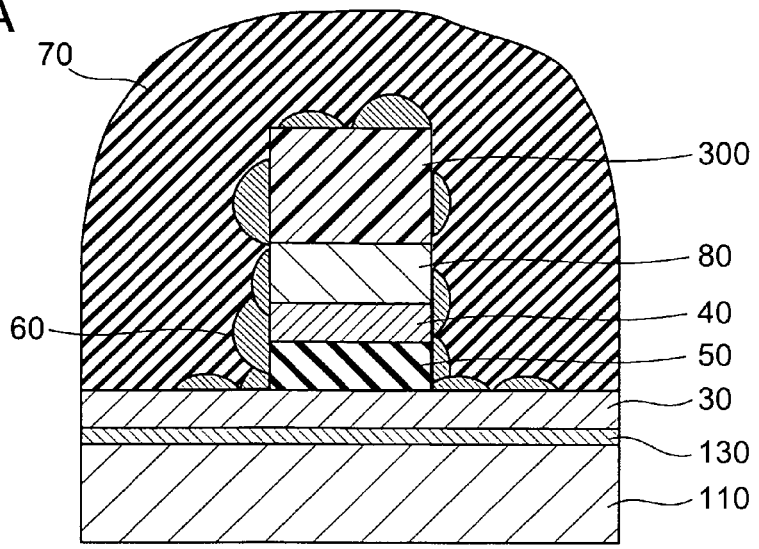
FIGS. 15A through 15C are process cross-sectional views illustrating a method for manufacturing a magnetoresistance effect device of the example shown in FIG. 10.

Next, as shown in FIG. 15A, an insulator layer 70 of alumina having a thickness of approximately 20 nm is deposited to prevent short circuit between the upper electrode and the first ferromagnetic layer 30.

Figure 15B:
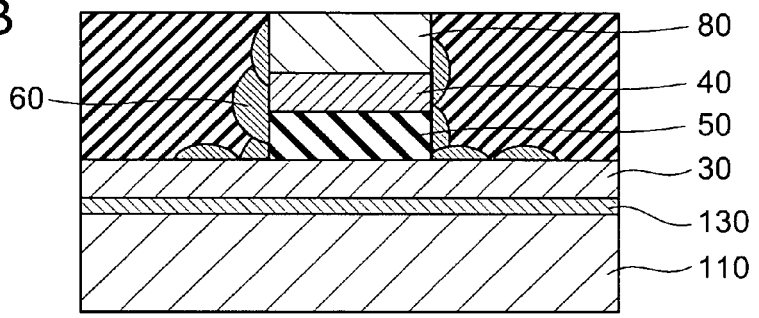

Next, as shown in FIG. 15B, the mask 300 is lifted off with organic solvent, and the surface of the insulator layer 70 is planarized as needed.

Figure 15C:
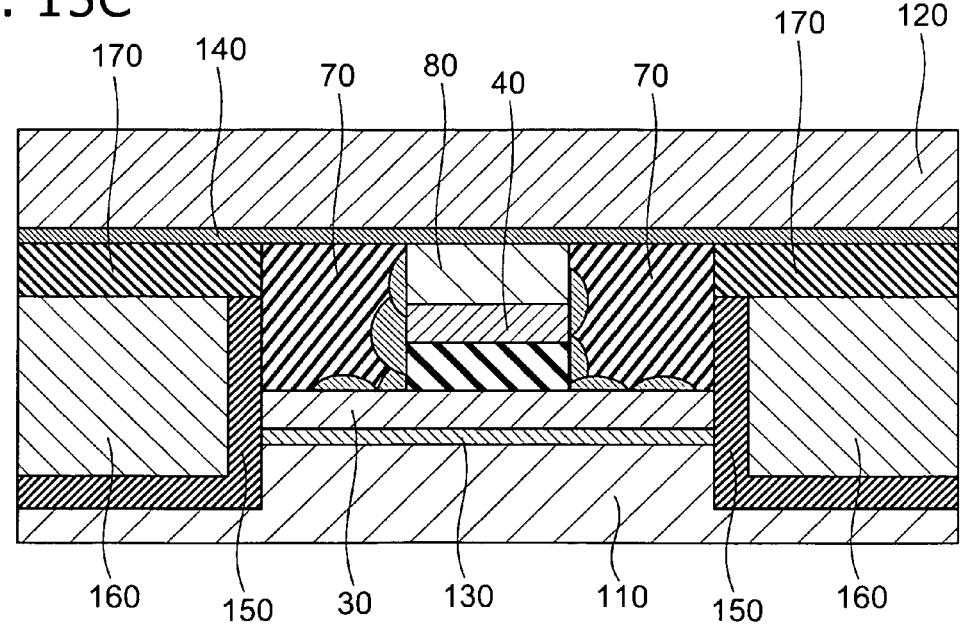

Next, as shown in FIG. 15C, the track width TW of the first ferromagnetic layer 30 is defined as approximately 30 nm. Then, on both sides thereof, bias layers 160 surrounded by insulator layers 150, 170 of alumina are formed. The bias layer 160 can be made of CoPt having a thickness of approximately 30 nm. Further thereon, an upper gap film 140 of Ta having a thickness of approximately 3 nm and an upper electrode (upper shield) 120 of NiFe having a thickness of approximately 1.5 μm are formed.

By the foregoing process, the main part of a shielded magnetic reproducing device is completed. It is noted that the trench structure as shown in FIG. 9 can be formed by forming a trench structure, instead of a mesa, extending to the first ferromagnetic layer 30 in the step of forming a mesa shown in FIG. 14B, and performing similar subsequent steps.

If the ferromagnetic layer 40 is made of a laminated film such as magnetic film/metal nonmagnetic film/magnetic film (so-called laminated ferri structure), magnetization occurring at the edge of the air bearing surface (ABS) can be suppressed.

Figure 16:
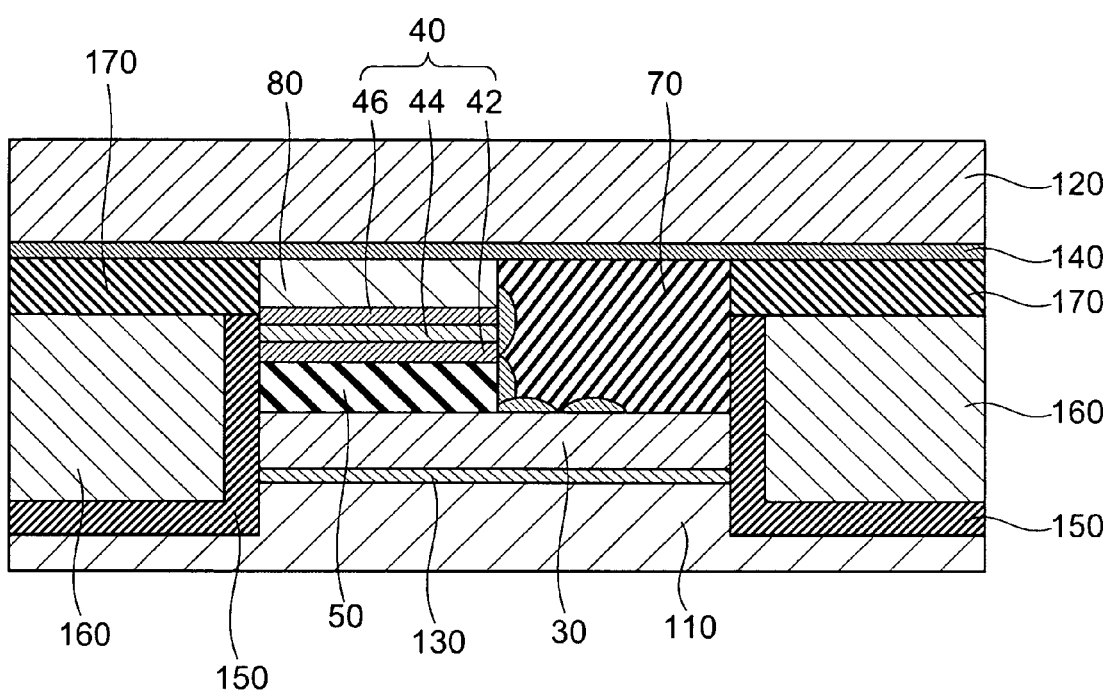
FIG. 16 is a schematic cross-sectional view showing another example of the magnetoresistance effect device of the invention.

FIG. 16 is a schematic cross-sectional view showing a magnetoresistance effect device that uses a laminated structure in the ferromagnetic layer 40. In this structure, the ferromagnetic layer 40 has a laminated structure composed of a magnetic film 42 of CoFe, a nonmagnetic film 44 of Ru (ruthenium), and a magnetic film 46 of CoFe. By using this structure, magnetization occurring at the edge of the air bearing surface can be suppressed. Hence a contact can be selectively formed in a portion at the center of the ferromagnetic layer (free layer) 30 having the best magnetic field sensitivity. Furthermore, in this structure, the laminated structure extending from the insulator layer 50 to the magnetic bias layer 80 can be patterned with a large size (corresponding to the process of FIG. 14B). Hence the structure can be easily formed even if the device is downsized to e.g. approximately 20 nm, being effective in terms of process yield.

Figure 17:
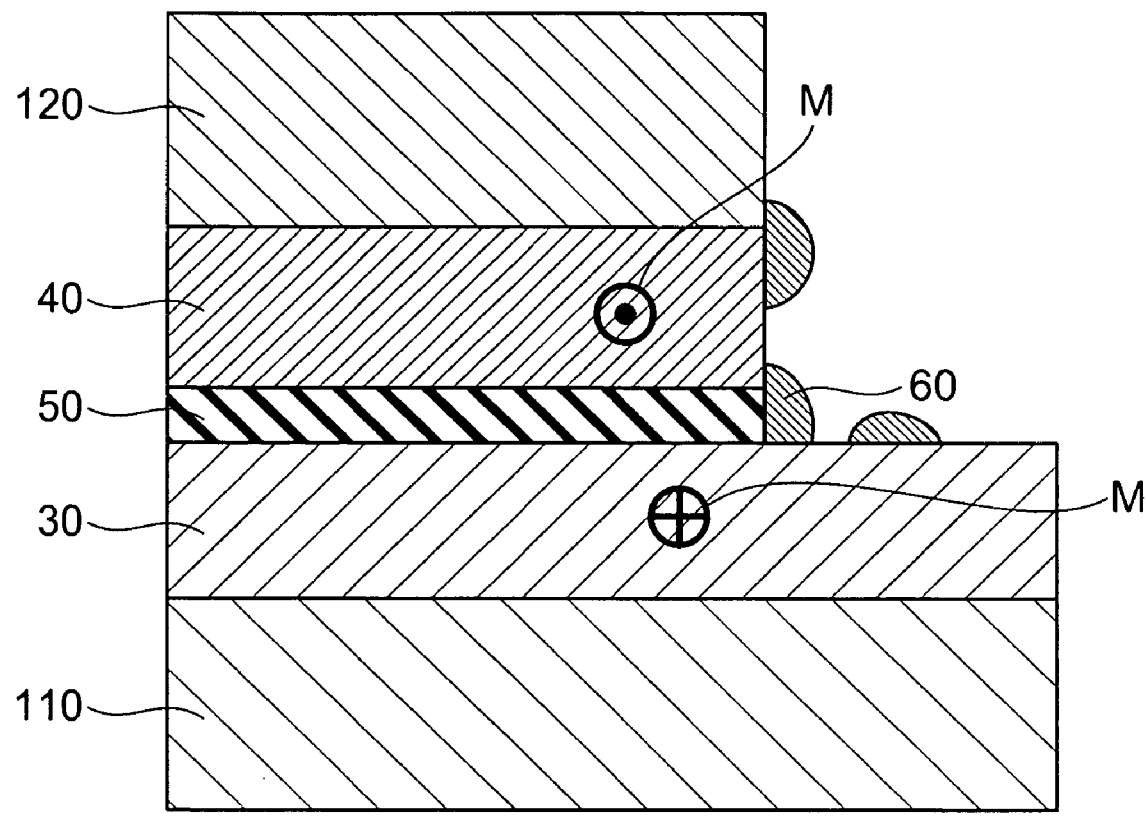
FIG. 17 is a schematic cross-sectional view showing a third example of the magnetoresistance effect device of the invention.

FIG. 17 is a schematic cross-sectional view showing a third example of the magnetoresistance effect device of the invention.

Figure 18:
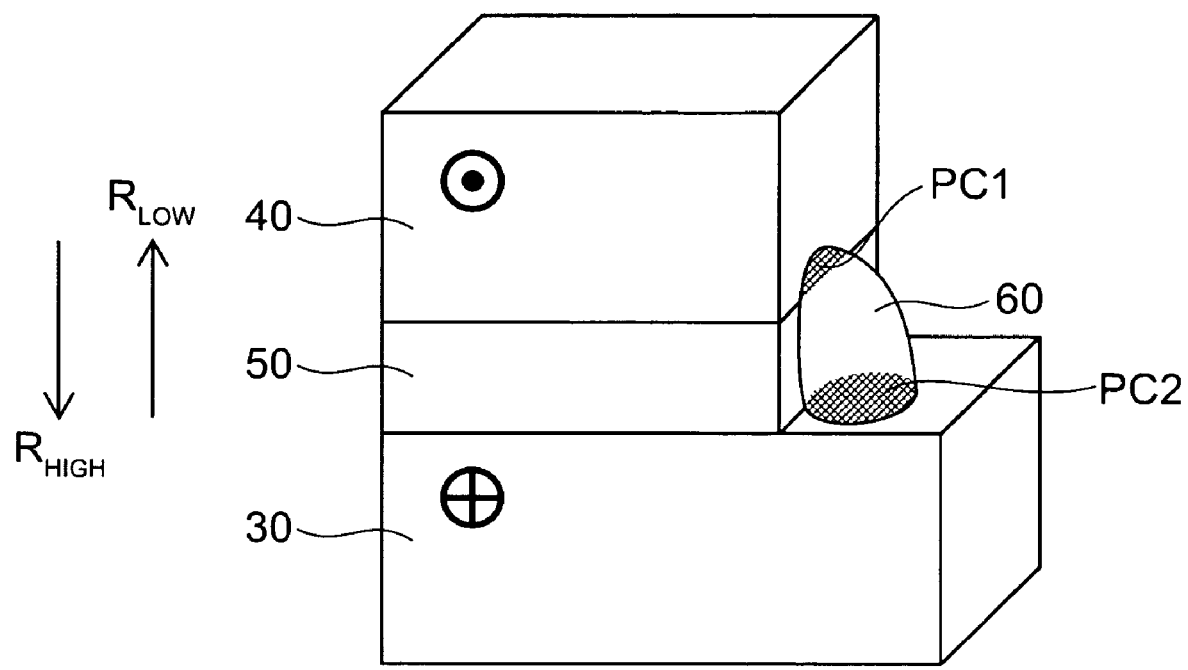
FIG. 18 is a schematic perspective view of the magnetoresistance effect device of the example of the invention.

FIG. 18 is a schematic perspective view of the magnetoresistance effect device of this example.

The magnetoresistance effect device of this example is suitable for use in a magnetic memory. More specifically, in the first and second ferromagnetic layer 30, 40, the direction of the magnetization M is fixed in the opposite direction with respect to each other. As described above with reference to FIG. 6, the connecting section 60 is made of one island, which connects between the first ferromagnetic layer 30 and the second ferromagnetic layer 40. As described above with reference to FIG. 6, in forming the connecting section 60, an initial growth nucleus is likely to occur at a step portion of the interface between the first ferromagnetic layer 30 and the insulator layer 50 and tends to grow from the major surface of the first ferromagnetic layer 30 along the side face of the insulator layer 50. That is, the connecting section 60 grows from the major surface of the first ferromagnetic layer 30 and is formed like an island. On average, as shown in FIG. 18, the cross section of the connecting section 60 perpendicular to the current flow direction decreases as it becomes close to the second ferromagnetic layer 40. For example, the area PC2 of the junction between the connecting section 60 and the first ferromagnetic layer 30 is large, whereas the area PC1 of the junction between the connecting section 60 and the second ferromagnetic layer 40 is small.

On the other hand, because the magnetization M of the first ferromagnetic layer 30 is different in direction from the magnetization M of the second ferromagnetic layer 40, a domain wall is formed in the connecting section 60. The resistance to the current passed between the lower electrode 110 and the upper electrode 120 is high upon introduction of the domain wall into the second ferromagnetic layer 40 side, and conversely low upon introduction of the domain wall into the first ferromagnetic layer 30 side. Here, in response to a flow of current above the critical current density (approximately $1 \times 10^{11}$ A/m$^2$), the domain wall formed in the connecting section 60 moves in the opposite direction of the current.

Hence, by the passage of current from the upper electrode 120 to the lower electrode 110, the domain wall pressed by electrons moves into the second ferromagnetic layer 40 side, and the resistance becomes high. On the other hand, by the passage of current from the lower electrode 110 to the upper electrode 120, the domain wall pressed by electrons moves into the first ferromagnetic layer 30 side, and the resistance becomes low.

By assigning such variation of resistance to information "1" and "0", the device can be used as a memory to which the information is written.

On the other hand, in the case of reproduction or reading, the resistance can be detected without moving the domain wall by the passage of current below the critical current density.

Thus the configuration of the vertically laminated ferromagnetic layers 30, 40 interconnected by a connecting section 60 is easily controlled in the growth direction of the connecting section 60, being advantageous in that the variation of resistance in response to the direction of write current can be easily specified.

FIG. 19 is a schematic perspective view for illustrating the position where the domain wall is trapped in this example.

Figure 19A:
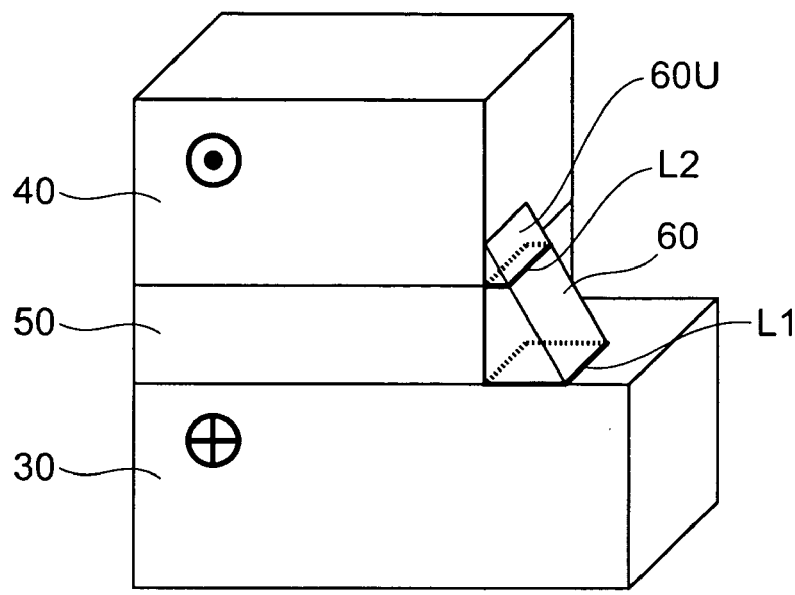
FIGS. 19A and 19B are schematic perspective views for illustrating the position where the domain wall is trapped in this example.

FIG. 19A shows a case where the connecting section 60 has no "constriction". That is, as described above with reference to FIGS. 3, 4, and 6, the upper portion 60U above the dashed line L2 is often in exchange coupling with the second ferromagnetic layer 40. Hence the domain wall is often formed in the portion of the dashed line L1, in the portion of the dashed line L2, or in the portion between L1 and L2. In the example shown in FIG. 19A, the cross-sectional area of the connecting section 60 continuously varies from the dashed line L1 to L2.

Figure 19B:
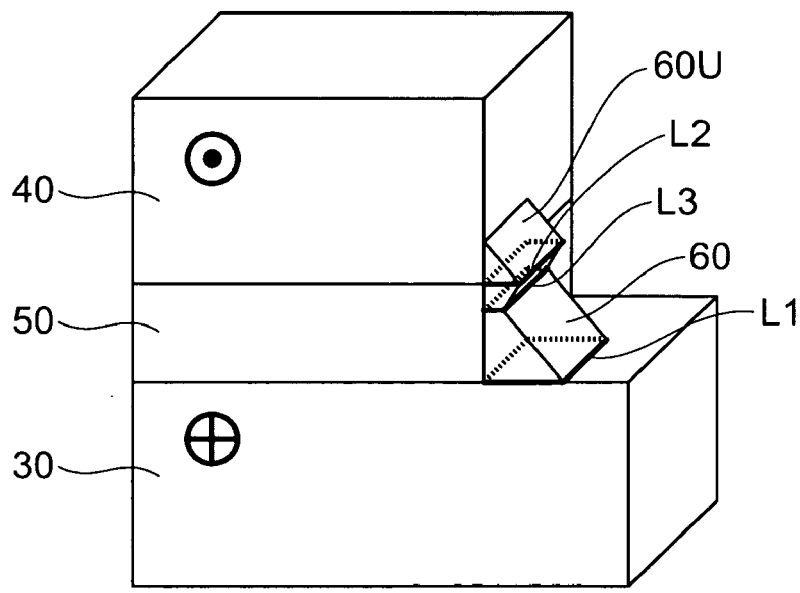

In contrast, in the example shown in FIG. 19B, a portion L3 having a small cross-sectional area due to a "constriction" exists between the dashed line L1 and the dashed line L2.

Figure 20:
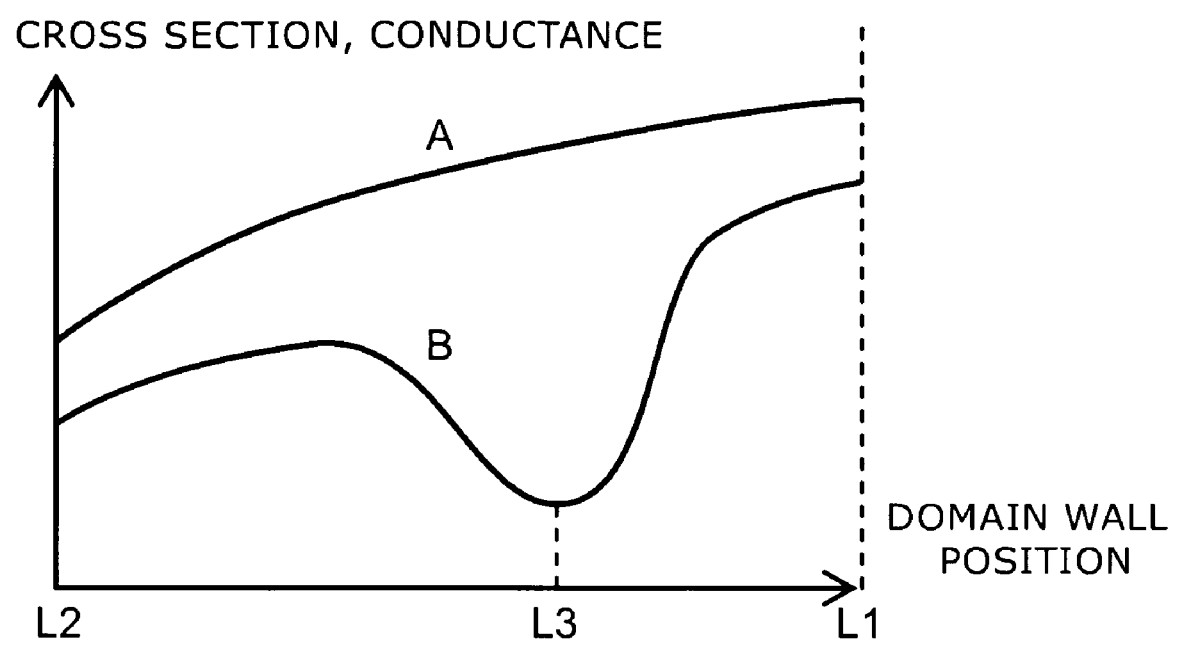
FIG. 20 is a graph showing the variation of cross-sectional area and conductance corresponding to examples of the invention.

FIG. 20 is a graph showing the variation of cross-sectional area and conductance corresponding to these examples.

The curve A shown in FIG. 20 corresponds to FIG. 19A. The cross-sectional area and conductance of the connecting section 60 continuously vary as the position of the domain wall moves from the dashed line L1 to L2. In contrast, the curve B corresponds to FIG. 19B. The cross-sectional area and conductance of the connecting section 60 has a minimum at the position of the dashed line L3 while the position of the domain wall moves from the dashed line L1 to L2. Here, the resistance of the magnetoresistance effect device is inversely proportional to the area of the domain wall formed in the connecting section 60.

Thus, while the behavior of the conductance (resistance) varies with the shape of the connecting section 60, the magnitude correlation of conductance (resistance) at the positions of the dashed lines L1 and L2 can be maintained. That is, by moving the domain wall between the ends (the positions of the dashed lines L1 and L2) of the connecting section 60, the transition between the high-resistance state and the low-resistance state can be steadily achieved as a whole.

In other words, by growing the connecting section 60 from the first ferromagnetic layer 30 toward the second ferromagnetic layer 40, the relationship between the direction of write current and the variation of resistance can be specified, and a magnetic memory performing a prescribed operation can be steadily formed.

Figure 21A:
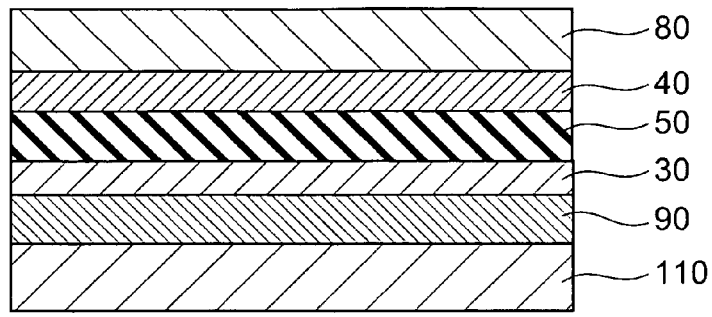
FIGS. 21A through 21C are process cross-sectional views illustrating a method for manufacturing a magnetoresistance effect device of the example of the invention.

FIGS. 21 and 22 are process cross-sectional views illustrating a method for manufacturing a magnetoresistance effect device of this example. First, a Cu film having a thickness of approximately 0.5 µm and a Ta film having a thickness of approximately 5 nm are successively formed as a lower electrode 110 on a substrate, not shown. After the surface of the lower shield 110 is polished and planarized, as shown in FIG. 21A, a foundation layer (not shown) of Ta having a thickness of approximately 3 nm, a magnetic bias layer 90 of an antiferromagnetic material such as PtMn having a thickness of approximately 20 nm, a first ferromagnetic layer 30 of NiFe having a thickness of approximately 5 nm, an insulator layer 50 of alumina having a thickness of approximately 10 nm, a second ferromagnetic layer 40 of NiFe having a thickness of approximately 3 nm, a magnetic bias layer 80 of an antiferromagnetic material such as IrMn having a thickness of approximately 13 nm, and a cap layer (not shown) of Ta having a thickness of approximately 3 nm are successively formed. Here, by forming the magnetic bias layers 80, 90 from antiferromagnetic materials having different Neel temperatures, magnetizations with opposite directions can be easily imparted by magnetic annealing.

Figure 21B:
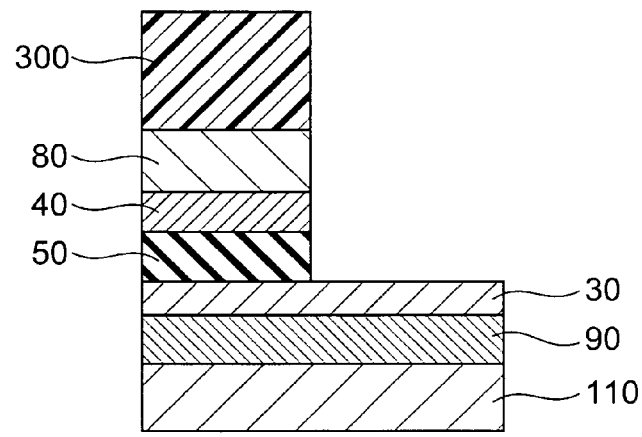

Next, as shown in FIG. 21B, in the vicinity of the center of the portion corresponding to the memory cell, a resist mask 300 is linearly formed by EB (electron beam) lithography, and etching is performed down to the surface of the first ferromagnetic layer 30 by ion milling. Here again, the endpoint at the surface of the first ferromagnetic layer 30 is easily obtained by transferring the pattern to an $SiO_2$ or other hard mask, performing RIE (reactive ion etching) with chlorine-based or carbon monoxide and ammonia-based gas, and stopping the etching at the insulator layer 50 of alumina, followed by ion milling.

Figure 21C:
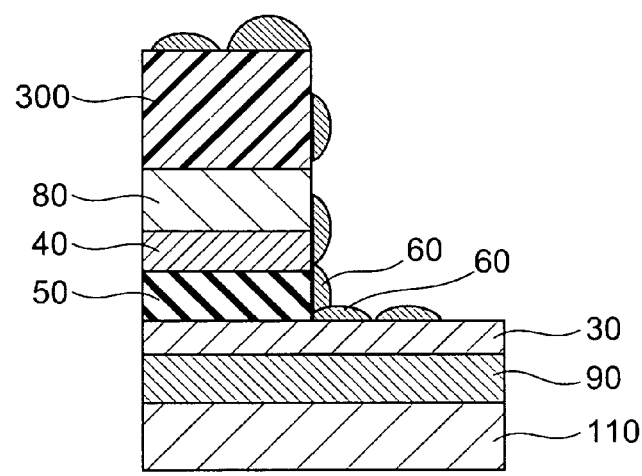

Next, as shown in FIG. 21C, a connecting section 60 of NiFe is formed by ion beam sputtering with an average flat-surface thickness of approximately 2 nm. Furthermore, its surface is etched approximately 1 nm by ion beams to form the connecting section 60 having an average thickness of approximately 1 nm. Thus a discontinuous connecting section 60 shaped like an island can be formed on the side face of the insulator layer 50.

Here, by repeating film formation and etching a plurality of times in forming the connecting section 60, the magnetoresistance effect was often enhanced due to the introduction of oxygen and defects into the junction interface even for a final reduced thickness of 1 nm. It is noted that in depositing the connecting section 60, the conventional sputtering or vacuum evaporation may be used instead of ion beam sputtering.

Figure 22A:
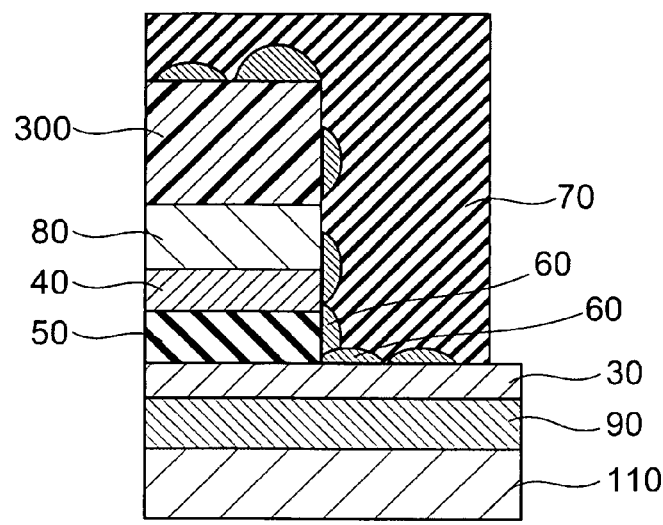
FIGS. 22A through 22C are process cross-sectional views illustrating a method for manufacturing a magnetoresistance effect device of the example of the invention.

Next, as shown in FIG. 22A, an insulator layer 70 of alumina having a thickness of approximately 20 nm is deposited to prevent short circuit between the upper electrode and the first ferromagnetic layer 30.

Figure 22B:
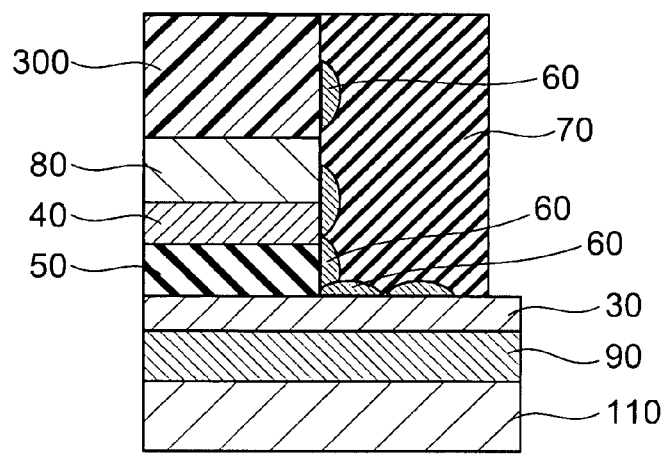

Next, as shown in FIG. 22B, the mask 300 is lifted off with organic solvent, and the surface of the insulator layer 70 is planarized as needed.

Figure 22C:
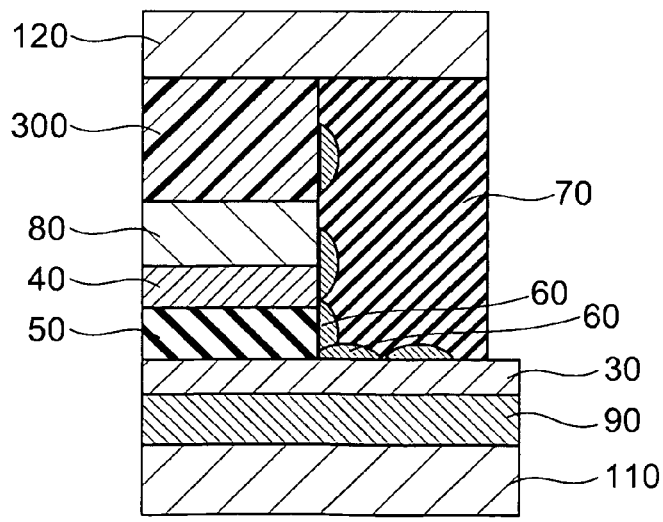

Next, as shown in FIG. 22C, the size of the memory cell is defined as e.g. approximately 100 nm square. Then, thereon, Ta with a thickness of approximately 3 nm and gold (Au) with a thickness of approximately 0.5 μm are deposited as an upper electrode 120.

By the foregoing process, the main part of a magnetic reproducing device serving as a magnetic memory is completed. It is noted also in this example that the trench structure as shown in FIG. 9 can be formed by forming a trench structure, instead of a mesa, extending to the first ferromagnetic layer 30 in the step of forming a mesa shown in FIG. 21B, and performing similar subsequent steps.

Figure 23:
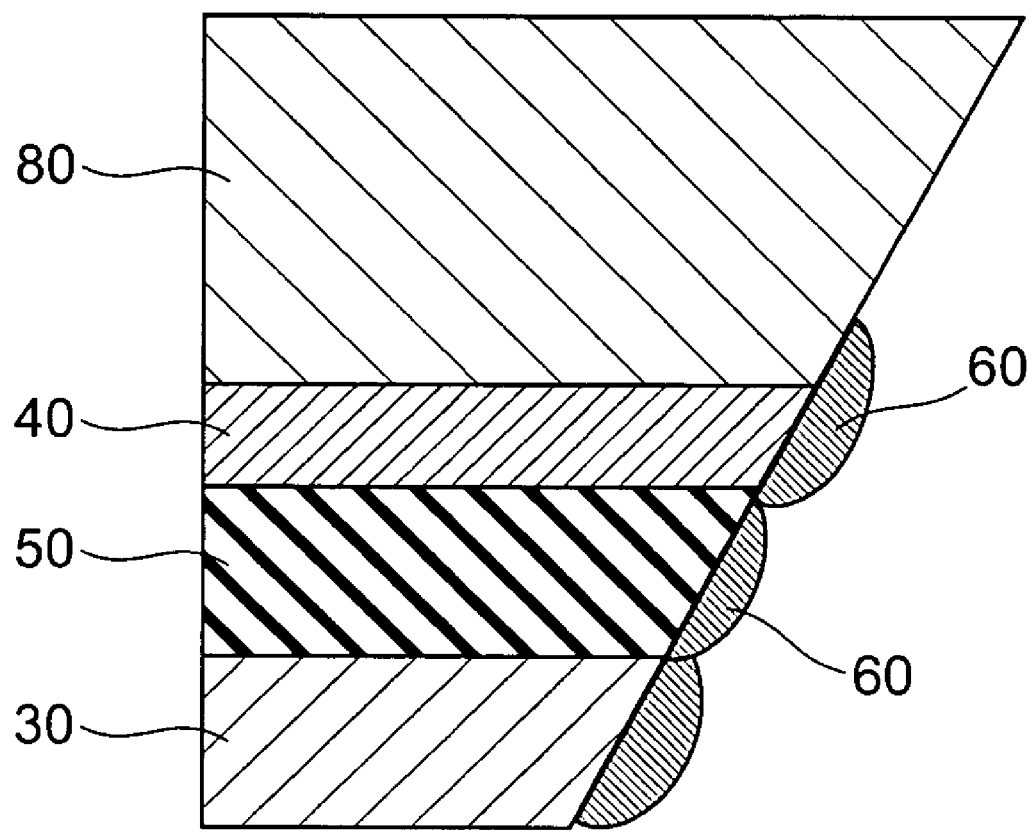
FIG. 23 is a schematic cross-sectional view showing a fourth example of the magnetoresistance effect device of the invention.

FIG. 23 is a schematic cross-sectional view showing a fourth example of the magnetoresistance effect device of the invention.

In this example, the side face of the laminated body composed of the first ferromagnetic layer 30, the insulator layer 50, and the second ferromagnetic layer 40 is tapered downward. That is, the side face of the laminated body is sloped outward along the direction from the first ferromagnetic layer 30 to the second ferromagnetic layer 40. The connecting section 60 is formed on this side face. Thus it is also possible to form a side face tapered downward and to form a connecting section 60 thereon.

Figure 24:
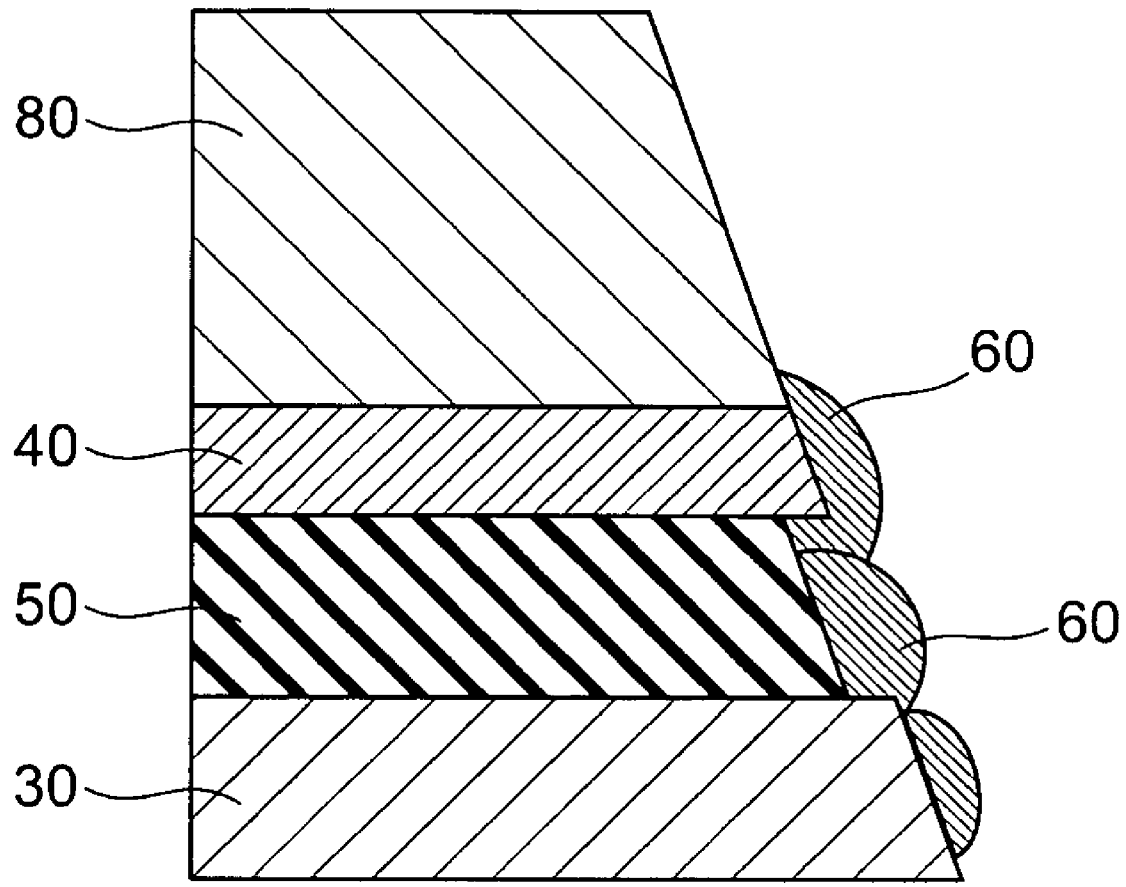
FIG. 24 is a schematic cross-sectional view showing a fifth example of the magnetoresistance effect device of the invention.

FIG. 24 is a schematic cross-sectional view showing a fifth example of the magnetoresistance effect device of the invention.

In this example, the side face of the insulator layer 50 is recessed relative to the side face of the first ferromagnetic layer 30 and the second ferromagnetic layer 40. The connecting section 60 is formed on this side face. Thus it is also possible to recess the side face of the insulator layer 50 and to form a connecting section 60 thereon. In this example, the recessed stepped portion is more likely to trap a domain wall, leading to enhancement in the magnetoresistance effect.

Figure 25:
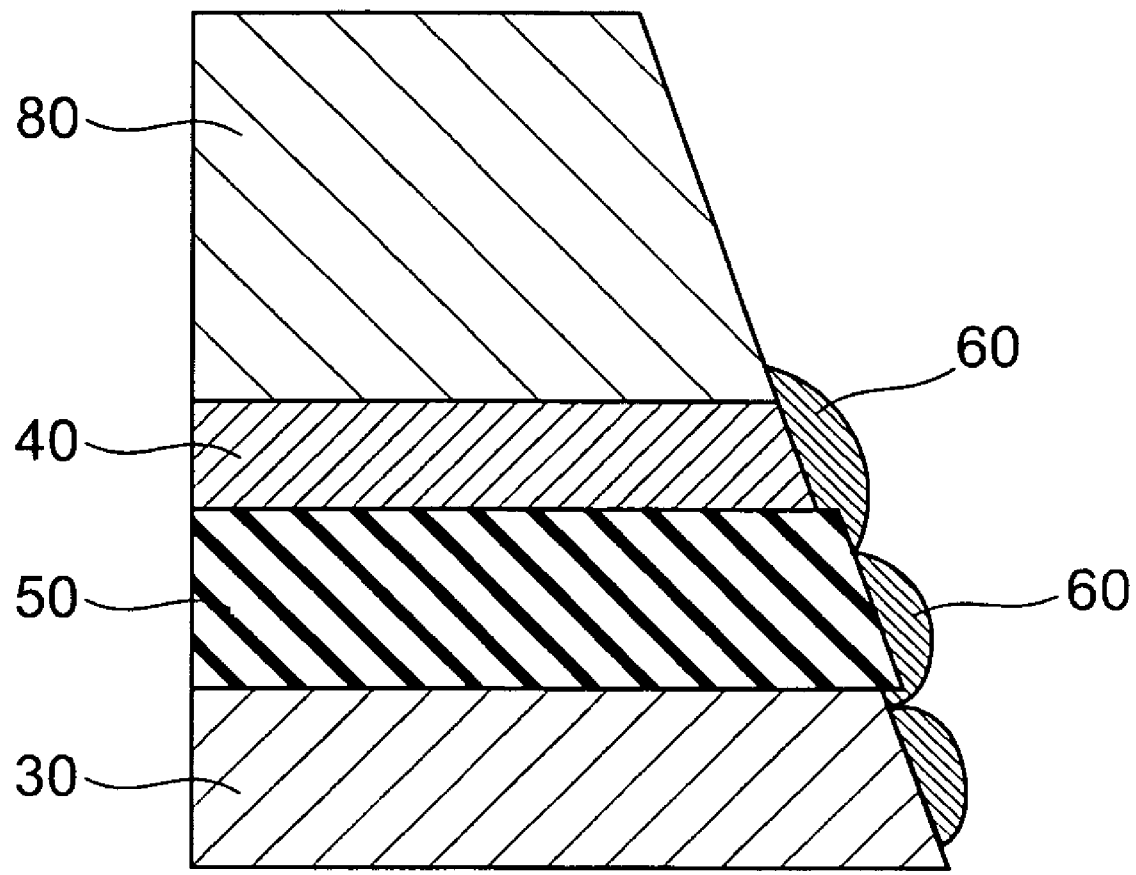
FIG. 25 is a schematic cross-sectional view showing a sixth example of the magnetoresistance effect device of the invention.

FIG. 25 is a schematic cross-sectional view showing a sixth example of the magnetoresistance effect device of the invention.

In this example, the side face of the insulator layer 50 is projected relative to the side face of the first ferromagnetic layer 30 and the second ferromagnetic layer 40. The connecting section 60 is formed on this side face. Thus it is also possible to project the side face of the insulator layer 50 and to form a connecting section 60 thereon. In this example, the projected stepped portion is more likely to trap a domain wall, leading to enhancement in the magnetoresistance effect.

Next, as a seventh example of the invention, a magnetic reproducing apparatus equipped with the magnetoresistance effect device 10 of the invention is described. More specifically, the magnetoresistance effect device 10 of the invention described with reference to FIGS. 1 to 25 is illustratively incorporated in an integrated read/write magnetic head assembly, which can be installed on a magnetic recording/reproducing apparatus.

Figure 26:
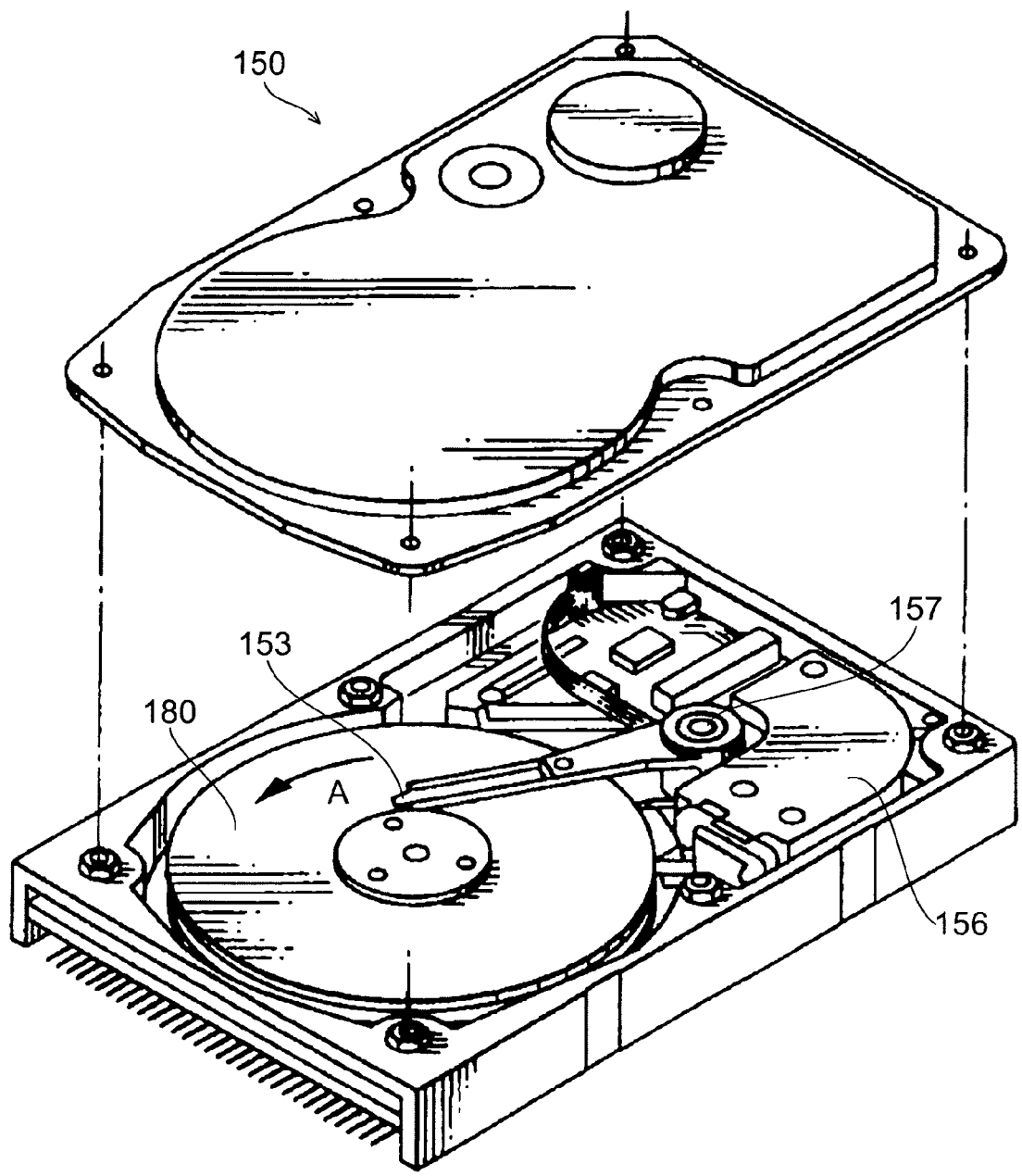
FIG. 26 is a principal perspective view illustrating the schematic configuration of a magnetic recording/reproducing apparatus.

FIG. 26 is a principal perspective view illustrating the schematic configuration of such a magnetic recording/reproducing apparatus. More specifically, the magnetic recording/reproducing apparatus 150 of the invention is an apparatus based on a rotary actuator. In this figure, a recording medium disk 180 is mounted on a spindle 152 and rotated in the direction of arrow A by a motor, not shown, in response to a control signal from a drive controller, not shown. The magnetic recording/reproducing apparatus 150 of the invention may include a plurality of medium disks 180.

A head slider 153 for recording/reproducing information stored on the medium disk 180 is attached to the tip of a thin-film suspension 154. Here, a magnetoresistance effect device 10 according to any one of the above examples is illustratively installed in the vicinity of the tip of the head slider 153.

When the medium disk 180 is rotated, the air bearing surface (ABS) of the head slider 153 is held at a prescribed floating amount from the surface of the medium disk 180. Alternatively, it is also possible to use a slider of the so-called "contact-traveling type", where the slider is in contact with the medium disk 180.

The suspension 154 is connected to one end of an actuator arm 155 including a bobbin for holding a driving coil, not shown. A voice coil motor 156, which is a kind of linear motor, is provided on the other end of the actuator arm 155. The voice coil motor 156 is composed of the driving coil, not shown, wound up around the bobbin of the actuator arm 155 and a magnetic circuit including a permanent magnet and an opposed yoke disposed so as to sandwich the coil therebetween.

The actuator arm 155 is held by ball bearings, not shown, provided at two positions above and below the spindle 157, and can be slidably rotated by the voice coil motor 156.

Figure 27:
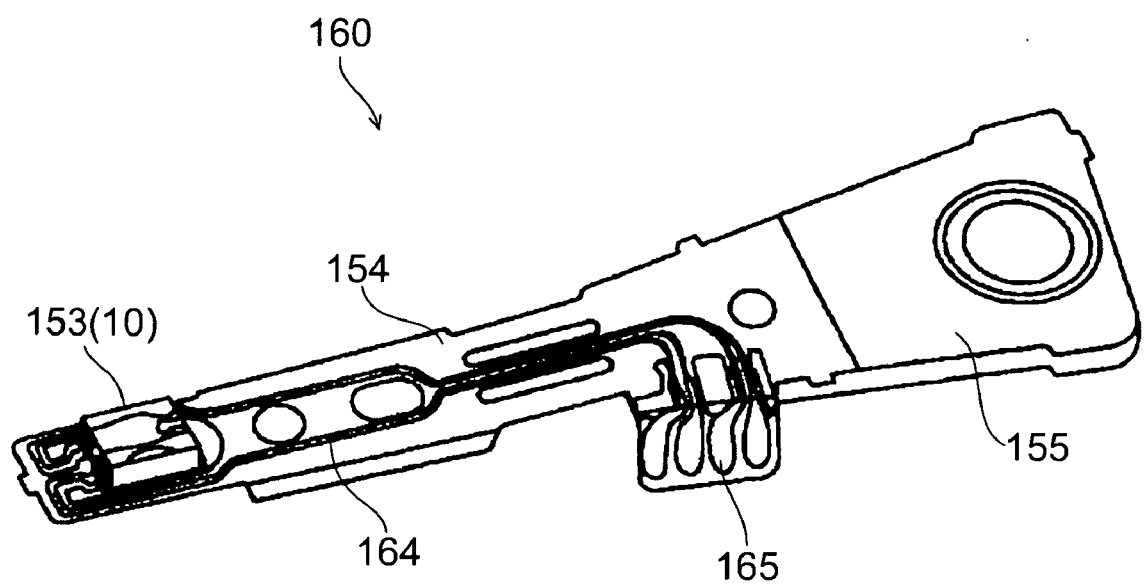
FIG. 27 is an enlarged perspective view of the magnetic head assembly ahead of the actuator arm 155 as viewed from the disk side.

FIG. 27 is an enlarged perspective view of the magnetic head assembly ahead of the actuator arm 155 as viewed from the disk side. More specifically, the magnetic head assembly 160 has an actuator arm 155 illustratively including a bobbin for holding a driving coil, and a suspension 154 is connected to one end of the actuator arm 155.

To the tip of the suspension 154 is attached a head slider 153 including any one of the magnetoresistance effect devices 10 described above with reference to FIGS. 1 to 25. The suspension 154 has a lead 164 for writing and reading signals. The lead 164 is electrically connected to each electrode of the magnetic head incorporated in the head slider 153. In the figure, the reference numeral 165 denotes an electrode pad of the magnetic head assembly 160.

According to the invention, by using the magnetoresistance effect device 10 of the invention as described above with reference to FIGS. 1 to 25, it is possible to reliably read information magnetically recorded on the medium disk 180 with higher recording density than conventional.

Next, as an eighth example of the invention, a magnetic memory equipped with the magnetoresistance effect device 10 of the invention is described. More specifically, the magnetoresistance effect device 10 of the invention described with reference to FIGS. 1 to 25 can be used to realize a magnetic memory such as a magnetic random access memory with memory cells arranged in a matrix.

Figure 28:
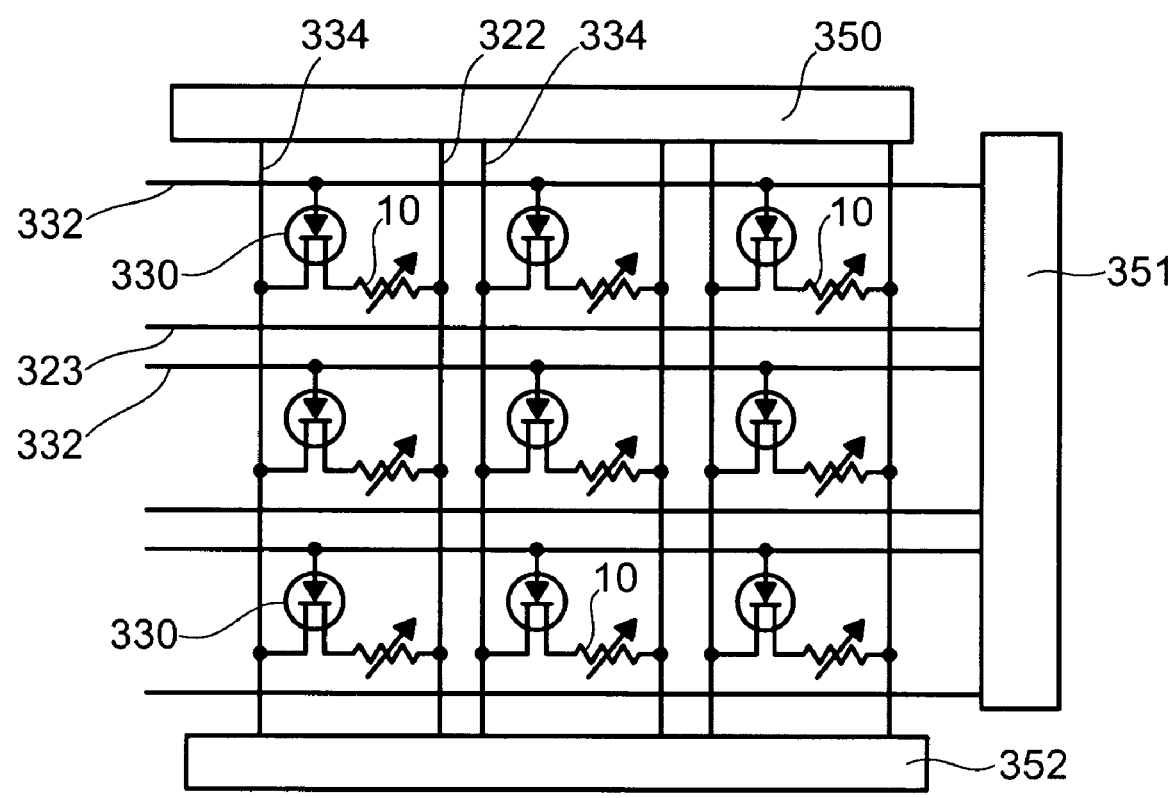
FIG. 28 is a conceptual view illustrating the matrix configuration of a magnetic memory of this example.

FIG. 28 is a conceptual view illustrating the matrix configuration of a magnetic memory of this example.

More specifically, this figure shows an example circuit configuration with memory cells arranged in an array. A column decoder 350 and a row decoder 351 are provided to select one bit in the array. By a bit line 334 and a word line 332, a switching transistor 330 is turned on and uniquely selected. Bit information recorded in the magnetic recording layer constituting the magnetoresistance effect device 10 can be read by detection using a sense amplifier 352.

Writing bit information is performed by passing a write current through a specific write word line 323 and bit line 322.

Figure 29:
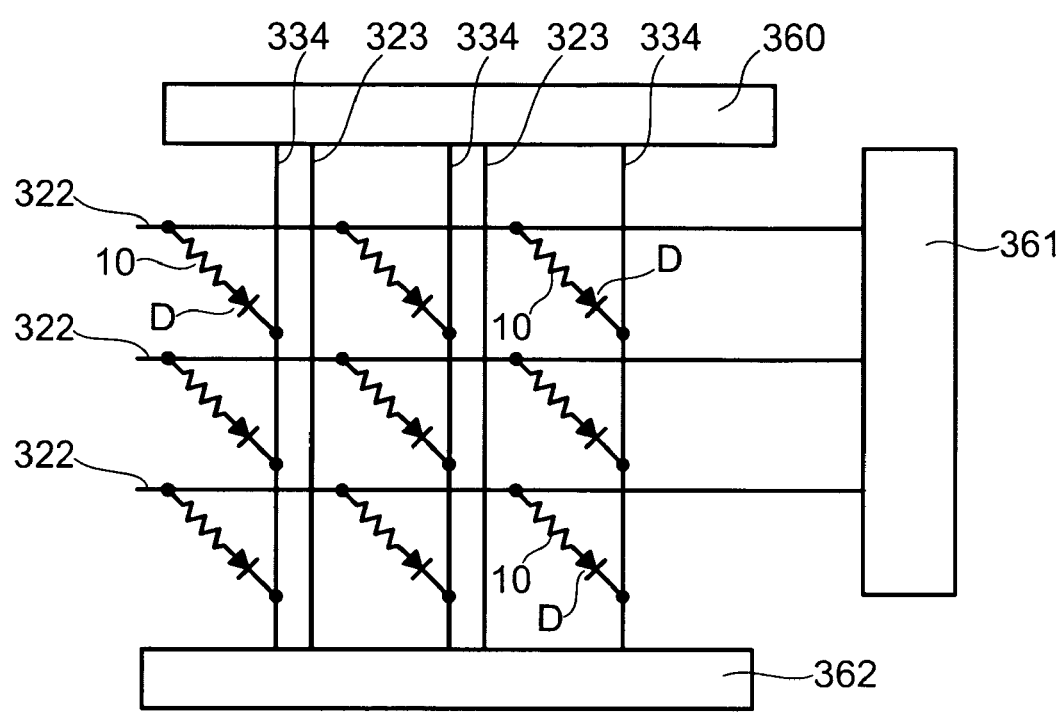
FIG. 29 is a conceptual view showing another example of the matrix configuration of the magnetic memory of this example.

FIG. 29 is a conceptual view showing another example of the matrix configuration of the magnetic memory of this example. More specifically, in this example, bit lines 322 and word lines 334 are wired in a matrix, and one of the bit lines 322 and one of the word lines 334 are selected by decoders 360, 361, respectively, to select a specific memory cell in the array. Each memory cell has a structure with the magnetoresistance effect device 10 and a diode D connected in series. Here, the diode D serves to prevent the sense current from bypassing the memory cells other than the selected magnetoresistance effect device 10.

Writing is performed by passing a write current through a specific bit line 322 and write word line 323.

The embodiment of the invention has been described with reference to the examples. However, the invention is not limited to the above examples. For instance, two or more of the examples described above with reference to FIGS. 1 to 29 can be combined as long as technically feasible, and such combinations are also encompassed within the scope of the invention.

That is, the invention is not limited to the examples, but can be practiced in various modifications without departing from the spirit of the invention, and such modifications are all encompassed within the scope of the invention.

The invention claimed is:

1. A magnetoresistance effect device comprising:
an insulator layer;
a first and second ferromagnetic layer laminated to sandwich the insulator layer;
a magnetic bias layer laminated with the second ferromagnetic layer; and
a connecting section formed discontinuously on a side face of the insulator layer, the connecting section being not interposed between the second ferromagnetic layer and the magnetic bias layer, being made of a ferromagnetic material, and electrically connecting between the first ferromagnetic layer and the second ferromagnetic layer.

2. The device according to claim 1, wherein
the first and second ferromagnetic layer and the magnetic bias layer each have side faces generally in continuation with the side face of the insulator layer, and
the connecting section connects between the side face of the first ferromagnetic layer and the side face of the second ferromagnetic layer.

3. The device according to claim 1, wherein
the second ferromagnetic layer has a side face generally in continuation with the side face of the insulator layer,
the side face of the insulator layer and the side face of the second ferromagnetic layer are provided on a surface of the first ferromagnetic layer, and
the connecting section connects between the surface of the first ferromagnetic layer and the side face of the second ferromagnetic layer.

4. The device according to claim 1, wherein
the first ferromagnetic layer has a step on its surface,
the second ferromagnetic layer has a side face generally in continuation with the side face of the insulator layer,
the side face of the insulator layer and the side face of the second ferromagnetic layer are provided generally in continuation with the step of the first ferromagnetic layer, and
the connecting section connects between the surface of the first ferromagnetic layer and the side face of the second ferromagnetic layer.

5. The device according to claim 1, wherein the connecting section includes a first island and a second island, the second island being in contact with the first island on the side face of the insulator layer.

6. The device according to claim 1, wherein the connecting section includes an island extending from the side face of the insulator layer to the first ferromagnetic layer and to the second ferromagnetic layer.

7. The device according to claim 1, wherein the connecting section contains a nonmagnetic element.

8. The device according to claim 7, wherein the nonmagnetic element is at least one selected from the group consisting of oxygen (O), fluorine (F), carbon (C), gold (Au), platinum (Pt), and copper (Cu).

9. The device according to claim 7, wherein a content of the nonmagnetic element in the connecting section is higher than contents of the nonmagnetic element in the first ferromagnetic layer and the second ferromagnetic layer.

10. The device according to claim 1, wherein
one of the first and second ferromagnetic layer has a fixed magnetization,
the other of the first and second ferromagnetic layer has a variable magnetization in response to an external magnetic field.

11. A magnetoresistance effect device comprising:
an insulator layer;
a first and second ferromagnetic layer laminated to sandwich the insulator layer;
a magnetic bias layer laminated with the second ferromagnetic layer; and
a connecting section formed discontinuously on a side face of the insulator layer, a side face of the second ferromagnetic layer, and a side face of the magnetic bias layer, the connecting section being made of a ferromagnetic material and electrically connecting between the first ferromagnetic layer and the second ferromagnetic layer.

12. The device according to claim 11, wherein the connecting section includes a first island and a second island, the second island being in contact with the first island on the side face of the insulator layer.

13. The device according to claim 11, wherein the connecting section includes an island extending from the side face of the insulator layer to the first ferromagnetic layer and to the second ferromagnetic layer.

14. The device according to claim 11, wherein the connecting section contains a nonmagnetic element.

15. The device according to claim 11, wherein
one of the first and second ferromagnetic layer has a fixed magnetization,
the other of the first and second ferromagnetic layer has a variable magnetization in response to an external magnetic field.

16. A method for manufacturing a magnetoresistance effect device, comprising:
laminating a first and second ferromagnetic layer to sandwich an insulator layer, and laminating a magnetic bias layer with the second ferromagnetic layer; and
forming a connecting section for electrically connecting between the first ferromagnetic layer and the second ferromagnetic layer by discontinuously forming a ferromagnetic material on a side face of the insulator layer.

17. The method according to claim 16, further comprising, between the step of laminating and the step of forming a connecting section:
selectively removing the second ferromagnetic layer and the insulator layer to form the side face.

18. A magnetic memory comprising:
a magnetoresistance effect device including:
an insulator layer;
a first and second ferromagnetic layer laminated to sandwich the insulator layer;
a magnetic bias layer laminated with the second ferromagnetic layer; and
a connecting section formed discontinuously on a side face of the insulator layer, the connecting section being not interposed between the second ferromagnetic layer and the magnetic bias layer, being made of a ferromagnetic material, and electrically connecting between the first ferromagnetic layer and the second ferromagnetic layer,
a current being passed between the first ferromagnetic layer and the second ferromagnetic layer to perform at least one of writing and reading.

19. The memory according to claim 18, wherein magnetization of the first ferromagnetic layer and magnetization of the second ferromagnetic layer are fixed generally in opposite direction with respect to each other.

20. A magnetic head comprising:
a magnetoresistance effect device including:
an insulator layer;
a first and second ferromagnetic layer laminated to sandwich the insulator layer;
a magnetic bias layer laminated with the second ferromagnetic layer; and
a connecting section formed discontinuously on a side face of the insulator layer, the connecting section being not interposed between the second ferromagnetic layer and the magnetic bias layer, being made of a ferromagnetic material, and electrically connecting between the first ferromagnetic layer and the second ferromagnetic layer,
the magnetic head being operable to read information magnetically recorded on a magnetic recording medium.

21. A magnetic recording apparatus comprising:
a magnetic head including:
a magnetoresistance effect device including:
an insulator layer;
a first and second ferromagnetic layer laminated to sandwich the insulator layer;
a magnetic bias layer laminated with the second ferromagnetic layer; and
a connecting section formed discontinuously on a side face of the insulator layer, the connecting section being not interposed between the second ferromagnetic layer and the magnetic bias layer, being made of a ferromagnetic material, and electrically connecting between the first ferromagnetic layer and the second ferromagnetic layer.

* * * * *